(12) United States Patent
Kozai

(10) Patent No.: US 6,785,877 B1
(45) Date of Patent: Aug. 31, 2004

(54) STANDARD CELL, STANDARD CELL ARRAY, AND SYSTEM AND METHOD FOR PLACING AND ROUTING STANDARD CELLS

(75) Inventor: Atsuko Kozai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 670 days.

(21) Appl. No.: 09/604,530

(22) Filed: Jun. 27, 2000

(30) Foreign Application Priority Data

Jun. 28, 1999 (JP) .......................................... 11-182445

(51) Int. Cl.[7] .............................................. G06F 17/50
(52) U.S. Cl. .............................. 716/12; 716/14; 716/13
(58) Field of Search ............................. 716/12, 18, 17, 716/1–11, 13–14; 257/207, 202, 204; 702/64; 703/15

(56) References Cited

U.S. PATENT DOCUMENTS

| | | | | |
|---|---|---|---|---|
| 5,349,542 A | * | 9/1994 | Brasen et al. ................. | 703/15 |
| 5,808,900 A | * | 9/1998 | Buer et al. .................... | 716/10 |
| 5,923,060 A | * | 7/1999 | Gheewala ................... | 257/207 |
| 6,069,373 A | * | 5/2000 | Iwaki ......................... | 257/204 |
| 6,145,117 A | * | 11/2000 | Eng ............................ | 716/18 |
| 6,385,761 B1 | * | 5/2002 | Breid ........................... | 716/8 |
| 6,405,346 B1 | * | 6/2002 | Nawa ........................... | 716/2 |
| 6,446,245 B1 | * | 9/2002 | Xing et al. ................... | 716/10 |
| 6,477,696 B2 | * | 11/2002 | Tien ............................ | 716/17 |
| 2002/0043667 A1 | * | 4/2002 | Shibata et al. ............... | 257/202 |
| 2003/0014201 A1 | * | 1/2003 | Schultz ........................ | 702/64 |

FOREIGN PATENT DOCUMENTS

| | | |
|---|---|---|
| EP | 0 609 096 A1 | 8/1994 |
| EP | 0 645 819 A2 | 9/1994 |
| JP | 3-62551 A | 3/1991 |
| JP | 3-62551 | 3/1991 |
| JP | 4-42560 A | 2/1992 |
| JP | 5-55381 | 3/1993 |
| JP | 05055381 | 3/1993 |
| JP | 5-304210 | 11/1993 |
| JP | 6-169016 | 6/1994 |
| JP | 6-200044 | 7/1994 |
| JP | 06209044 | 7/1994 |
| JP | 7-94586 | 4/1995 |
| JP | 7-106649 | 4/1995 |
| JP | 7-130972 | 5/1995 |
| JP | 8-18021 | 1/1996 |
| JP | 8-213577 | 8/1996 |

(List continued on next page.)

Primary Examiner—Vuthe Siek
Assistant Examiner—Magid Y. Dimyan
(74) Attorney, Agent, or Firm—Choate, Hall & Stewart

(57) ABSTRACT

In a placement and routing for a standard cell type LSI design, each standard cell comprises a VDD power supply terminal formed of a P-type diffused layer, a VSS power supply terminal formed of an N-type diffused layer, and an input terminal and an output terminal formed of a first level metal. A plurality of standard cells are located to form a standard cell array, and VDD and VSS power supply lines formed of the first level metal are located to extend along opposite sides of the standard cell array, respectively. For connecting the power supply terminal of the standard cell to the power supply line of the first level metal, a power supply line formed of the diffused layer is extended from the power supply terminal to the power supply line of the first level metal, and a contact bole is formed at an overlapping portion between the power supply line of the first level metal and power supply line formed of the diffused layer. Thus, it is possible to place and route standard cells having different widths with no hindrance, and it is also possible to form an inter-cell connection in the device formation region between the power supply line and the wiring area within the cell. In addition, it is possible to set the width of the power supply line of the first level metal to an appropriate width for each standard cell array.

6 Claims, 18 Drawing Sheets

FOREIGN PATENT DOCUMENTS

| | | |
|---|---|---|
| JP | 8-236634 | 9/1996 |
| JP | 10-144794 | 5/1998 |
| JP | 11045942 | 2/1999 |
| WO | WO 97 18591 | 5/1997 |

* cited by examiner

- 118 VDD terminal
- 111 N-well
- 112 P-type diffused layer
- 117 first level metal
- 116 contact hole
- 114
- 113 N-type diffused layer
- 119 VSS terminal
- 102 2-input NOR cell

- 118 VDD terminal
- 111 N-well
- 112 P-type diffused layer
- 114
- 116 contact hole
- 103 2-input NAND cell
- 113 N-type diffused layer

STANDARD CELL, STANDARD CELL ARRAY, AND SYSTEM AND METHOD FOR PLACING AND ROUTING STANDARD CELLS

BACKGROUND OF THE INVENTION

The present invention relates to a standard cell formed on a semiconductor substrate, a standard cell array formed on a semiconductor substrate, and a system and a method for placing and routing standard cells.

As a layout design technology for realizing a LSI (large scale integrated circuit) on a semiconductor substrate with a high integration density for a short period of time, a standard cell type LSI design technology is widely utilized, in which small unitary circuits such as an inverter and an NAND gate are previously prepared as standard cells, and those standard cells are placed in the form of an array and interconnected to form an LSI.

Referring to FIG. 18A, a layout diagram of a standard cell type LSI is illustrated. A plurality of cell arrays are placed, each of the cell arrays being formed of a plurality of function cells 106 having the same width (height in the drawing) and placed in the form of an array. A routing channel 1801 is reserved between each pair of adjacent cell arrays. In the routing channel 1801, there are located an inter-cell connection 1802 for interconnecting between cells included in the same cell array, and an inter-array connection 1803 for interconnecting between cells which are included in different cell arrays, respectively.

Referring to FIG. 18B, there is shown a pattern diagram of the inside of one typical prior art standard cell. The shown standard cell is a function cell 106a having an inverter function. In FIG. 18B, the reference number 111 designates an N-well, and the reference number 112 indicates a P-type diffused layer. The reference number 113 shows an N-type diffused layer, and the reference number 114 denotes a polysilicon. The reference number 115 designates a contact hole between the P-type or N-type diffused layer and a first level metal. The reference number 116 indicates a contact hole between the polysilicon and the first level metal. The reference number 117 shows the first level metal. The reference number 120 denotes a VDD power supply line formed of the first level metal. The reference number 121 designates a VSS power supply line formed of the first level metal. In the N-well 111, a P-channel MOS transistor having a source and a drain formed of the P-type diffused layer 112 is formed. In a P-type substrate region at the outside of the N-well, an N-channel MOS transistor having a source and a drain formed of the N-type diffused layer 113 is formed.

In the prior art standard cell, all the cells have the same constant width (height in FIG. 18B), and the VDD power supply line 120 and the VSS power supply line 121 having the same fixed width are located at an upper end portion and at a lower end portion of the cell, respectively, as shown in FIG. 18B. An area between the pair of power supply lines in the cell is used to form the transistors included in the cell and to locate interconnections between terminals (contacts) within the cell (called an "in-cell wiring" in this specification). On the other hand, the routing channel has to be used for the interconnection between cells. However, the width of the cell is determined to meet a function cell such as a flipflop which needs a number of transistors and a complicated in-cell wiring. Therefore, the following problem has been encountered in the prior art standard cell. In a relatively simple function cell such as an inverter and a 2-input NAND gate which has a simple in-cell wiring, although there arise many empty areas for the first level metal, the empty areas could not be utilized for the inter-cell connection. In addition, the power supply lines extending through all the standard cells have the constant width, and it is not so easy to change the width of the power supply lines in accordance with the magnitude of a required power supply current.

Under this situation, Japanese Patent Application Pre-examination Publication No. JP-A-06-169016 discloses a standard cell having an empty area which is provided between a power supply line and an in-cell wiring area and which can be utilized for the inter-cell connection. Referring to FIG. 19A, there is shown a wiring area diagram of a standard cell in accordance with this second prior art. An empty area 123 is provided between the VDD line 120 of the first level metal and an in-cell wiring area 122, and another empty area 124 is provided between the VSS line 121 of the first level metal and the in-cell wiring area 122. These empty areas 123 and 124 can be utilized for the inter-cell connection so as to realize an elevated integration density.

In addition, Japanese Patent Application Pre-examination Publication No. JP-A-03-062551 discloses a standard cell having a device formation area extending into an outside of the power supply line. Referring to FIG. 19B, there is shown a wiring area diagram of a standard cell in accordance with this third prior art. An in-cell wiring area 122 is provided between the VDD line 120 and the VSS line 121, similarly to the first prior art example shown in FIG. 18B. However, a device formation area 125 depicted by a chain line extends into an outside of each power supply line. Since this outside area can be utilized as a wiring area, the outside area can be utilized for the inter-cell connection. In addition, even if the position of the power supply lines is standardized for all the cells, it is possible to freely set a substantial cell width determined by the size of the device formation area.

Furthermore, Japanese Patent Application Pre-examination Publication No. JP-A-05-055381 proposes a standard cell having no power supply line pattern. Referring to FIG. 19C, there is shown a wiring area diagram of a standard cell in accordance with this fourth prior art. The standard cell includes only an in-cell wiring area 122 including transistors formed in the cell and a wiring pattern for connecting between terminals in the cell. After a required number of standard cells are placed in the form of an array, a power supply line pattern which has a line width determined on the basis of the length of the cell array and a power consumption, is generated to connect to each standard cells. Therefore, the power supply line can have an optimum line width.

However, the standard cell of the second prior art are difficult to optimize the width of the power supply line, and are restricted to have a constant cell width. The standard cell of the third prior art is difficult to optimize the width of the power supply line. The standard cell of the fourth prior art are restricted to have a constant cell width. In addition, since the device formation area is not used for the inter-cell connection, the wiring density is low.

BRIEF SUMMARY OF THE INVENTION

Accordingly, it is an object of the present invention to provide a standard cell, a standard cell array, and a system and a method for placing and routing standard cells, which have overcome the above mentioned problems of the prior art.

Another object of the present invention is to provide a standard cell, a standard cell array, and a system and a method for placing and routing standard cells, capable of forming an inter-cell connection in an area between a power supply line and an in-cell wiring area and also capable of ensuring the power supply line having an optimum line width, without a restriction requiring a constant cell width.

According to a first aspect of the present invention, there is provided a standard cell comprising a power supply terminal of a diffused layer, an input terminal of a first level metal and an output terminal of the first level metal.

More specifically, the standard cell in accordance with the present invention comprises a function circuit including at least one P-channel transistor and at least one N-channel transistor; a first power supply terminal for supplying a first power supply voltage to the at least one P-channel transistor, a second power supply terminal for supplying a second power supply voltage to the at least one N-channel transistor, and an input terminal and an output terminal for the function circuit. The first power supply terminal is provided at a P-type diffused layer of the at least one P-channel transistor supplied with the first power supply voltage, and the second power supply terminal is provided at an N-type diffused layer of the at least one N-channel transistor supplied with the second power supply voltage. The input terminal of the first level metal and the output terminal of the first level metal constitute the input terminal and the output terminal for the function circuit, respectively.

According to a second aspect of the present invention, there is provided a standard cell array including a plurality of standard cells in accordance with the first aspect of the present invention, said plurality of standard cells being formed on a semiconductor substrate and located in the form of an array. The plurality of standard cells are located in such a manner that respective well boundary lines within the standard cells are aligned on one straight line, and a substrate contact cell for connecting a first power supply voltage and a second power supply voltage to the semiconductor substrate and a well formed in the semiconductor substrate, respectively, is inserted into the standard cell array at predetermined intervals, at least one for a predetermined number of standard cells.

According to a third aspect of the present invention, there is provided a standard cell placement and routing processing system comprising a library file which stores information of various standard cells in accordance with the first aspect of the present invention, a circuit connection information file which stores circuit connection information of an LSI to be developed, a constraint information file which stores constraint information concerning the placement and the routing, a parameter file which stores parameter information including a power supply voltage and an operating frequency of the LSI to be developed and a sheet resistance of the diffused layer, a placement and routing system for executing the placement and the routing of standard cells selected in accordance with the circuit connection information from the circuit connection information file, by utilizing information from the library file, the constraint information file and the parameter file, and an input/output and display apparatus for displaying a history and a result of the placement and the routing and for externally inputting a control command to control the placement and routing system.

According to a fourth aspect of the present invention, there is provided a standard cell placement and routing method for executing a placement and routing of standard cells by using the standard cell placement and routing processing system in accordance with the third aspect of the present invention, the method comprising:

a first step of reading out the circuit connection information from the circuit connection information file;

a second step of reading out from the cell library file, standard cells corresponding to the read-out circuit connection information, and locating the read-out standard cells into a plurality of standard cell arrays, each of the plurality of standard cell arrays including at least one substrate contact cell inserted for every a predetermined number of standards cells, and the standard cells included in each of the plurality of standard cell arrays being arranged in such a manner that respective well boundary lines within the standard cells in each standard cell array are aligned on one straight line in a plan view;

a third step of routing signal lines between the standard cells included in the standard cell array, in accordance with the circuit connection information;

a fourth step of extracting a contour of a wiring area of the signal lines within the standard cell array, and placing a power supply line at the outside of the wiring area;

a fifth step of forming a contact hole at an overlapping portion between the power supply line and the power supply terminal of the diffused layer within the standard cell in the standard cell array, or alternatively, extending a power supply line of the diffused layer from the power supply terminal to the power supply line when the power supply terminal does not overlap the power supply line, and then, forming a contact hole at an overlapping portion between the power supply line and the power supply line of the diffused layer;

a sixth step of discriminating whether or not the resistance of the power supply line of the diffused layer is not greater than a predetermined resistance value stored in the constraint information file;

a seventh step of re-routing the signal lines between the standard cells when it is discriminated in the sixth step that the resistance of the power supply line of the diffused layer is greater than the predetermined resistance value, and then, returning to the fourth step; and an eighth step of routing a not-connected interconnection in the standard cell array and signal lines between the standard cell arrays when it is discriminated in the sixth step that the resistance of the power supply line of the diffused layer is not greater than the predetermined resistance value.

Specifically, the second step can include:

a first sub-step of reading out from the cell library file, the standard cells corresponding to the read-out circuit connection information, and locating the read-out standard cells into a plurality of standard cell arrays in such a manner that respective well boundary lines within the standard cells in each standard cell array are aligned on one straight line in a plan view;

a second sub-step of inserting the at least one substrate contact cell for every a predetermined number of standards cells in each standard cell array, to complete the plurality of standard cell arrays;

a third sub-step of calculating a power supply line width on the basis of information including the number of the standard cells and the kinds of the standard cells included the standard cell array, the power supply voltage, and the operating frequency;

a fourth sub-step of calculating the width of a routing channel required from the power supply line width, the number of signal lines, and signal paths; and a fifth sub-step of discriminating whether or not the routing is possible, with reference to a chip size stored in the constraint information file, and returning to the first sub-step when the routing is not possible, and on the other hand, completing the second step when the routing is possible.

Furthermore, the fifth step can include:

a first sub-step of extracting the power supply terminals of the standard cells included in the standard cell array;

a second sub-step of discriminating whether or not the extracted power supply terminal overlaps the power supply line;

a third sub-step of extending the power supply line of the diffused layer from the extracted power supply terminal to the power supply line when the extracted power supply terminal does not overlap the power supply line, so that the power supply line of the diffused layer overlaps the power supply line; and a fourth sub-step of forming a contact hole at an overlapping portion between the extracted power supply terminal and the power supply line when it is discriminated in the second sub-step that the extracted power supply terminal overlaps the power supply line, or alternatively at an overlapping portion between the power supply line and the power supply line of the diffused layer when it is discriminated in the second sub-step that the extracted power supply terminal does not overlap the power supply line.

In addition, the seventh step can include:

a first sub-step of detecting a signal line which becomes a hindrance in reducing the resistance of the power supply line formed of the diffused layer to not greater than the predetermined resistance value;

a second sub-step of removing the signal line which becomes the hindrance, and providing a through-hole for connecting between the first level metal and a second level metal at an end position to which the removed signal line was connected; and a third sub-step of discriminating whether or not the resistance of the power supply line formed of the diffused layer shortened as the result of the removal of the signal line is not greater than the predetermined resistance value, and returning to the first sub-step when the resistance is greater than the predetermined resistance value, or alternatively completing the seventh step when the resistance is not greater than the predetermined resistance value.

According to a fifth aspect of the present invention, there is provided a standard cell placement and routing method for executing a placement and routing of standard cells by using a standard cell placement and routing processing system in accordance with the third aspect of the present invention, the method comprising:

a first step of reading out the circuit connection information from the circuit connection information file;

a second step of reading out from the cell library file, standard cells corresponding to the read-out circuit connection information, and provisionally locating the read-out standard cells into a plurality of provisional standard cell arrays;

a third step of dividing the provisional standard cell array into a plurality of cell groups each including not greater than a predetermined number of standard cells which are located adjacent to one another;

a fourth step of selecting one cell group to be processed, from the plurality of cell groups;

a fifth step of routing signal lines between the standard cells within the one selected cell group, in accordance with the circuit connection information from the circuit connection information file;

a sixth step of extracting a contour of a wiring area of the signal lines within the one selected cell group, to register a power supply line inhibit area in the constraint information file;

a seventh step of placing a power supply line along the outside of the power supply line inhibit area within the one selected cell group;

an eighth step of forming a contact hole at an overlapping portion between the power supply line and the power supply terminal of the diffused layer within the standard cell in the one selected cell group, or alternatively, extending a power supply line of the diffused layer from the power supply terminal to the power supply line when the power supply terminal does not overlap the power supply line, and then, forming a contact hole at an overlapping portion between the power supply line and the power supply line of the diffused layer;

a ninth step of discriminating whether or not the resistance of the power supply line of the diffused layer is not greater than a predetermined resistance value stored in the constraint information file;

a tenth step of re-routing the signal lines between the standard cells when it is discriminated in the ninth step that the resistance of the power supply line of the diffused layer is greater than the predetermined resistance value, and then, returning to the fifth step;

an eleventh step of discriminating whether or not the processing for all the cell groups has been completed, when it is discriminated in the ninth step that the resistance of the power supply line of the diffused layer is not greater than the predetermined resistance value, and then, returning to the fourth step when the processing for all the cell groups has not yet been completed;

a twelfth step of replacing the provisional standard cell array composed of the provisionally located standard cells, with corresponding cell groups processed above, when it is discriminated in the eleventh step that the processing for all the cell groups has been completed;

a thirteenth step of interconnecting respective power supply lines of the cell groups processed above to form a power supply line for the standard cell array; and a fourteenth step of routing a not-connected interconnection in the standard cell array and signal lines between the standard cell arrays.

The above and other objects, features and advantages of the present invention will be apparent from the following description of preferred embodiments of the invention with reference to the accompanying drawings.

DETAILED DESCRIPTION OF THE INVENTION

Figure 1A:
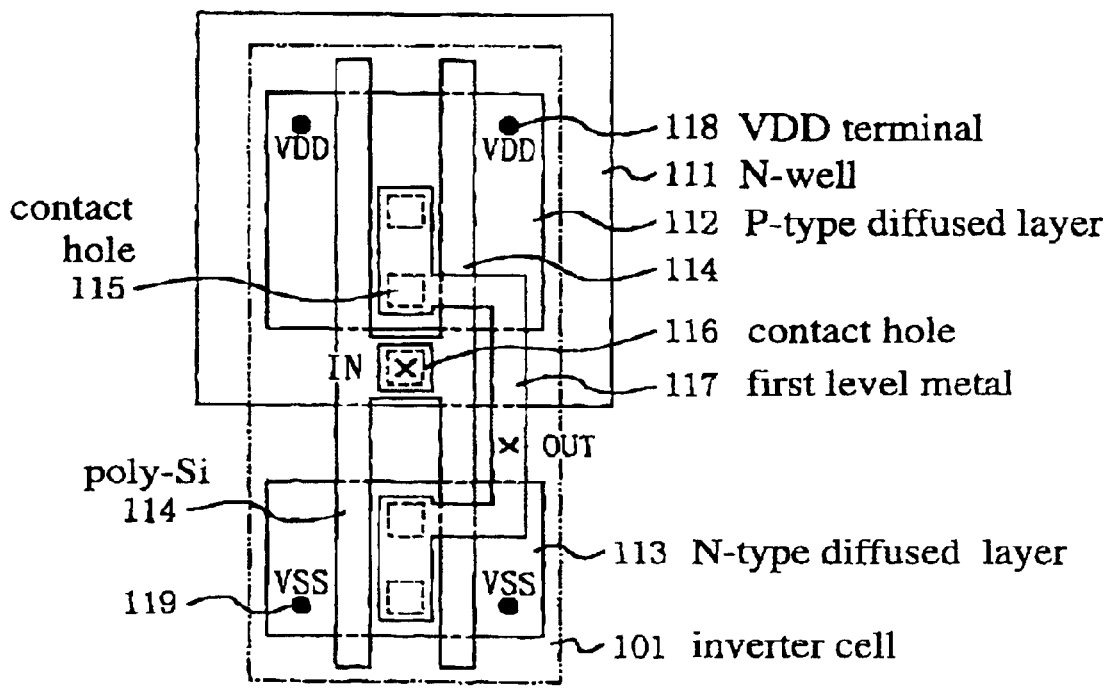
FIGS. 1A and 1B are pattern diagrams of an inverter cell which is one embodiment of the standard cell in accordance with the present invention.
Figure 1B:
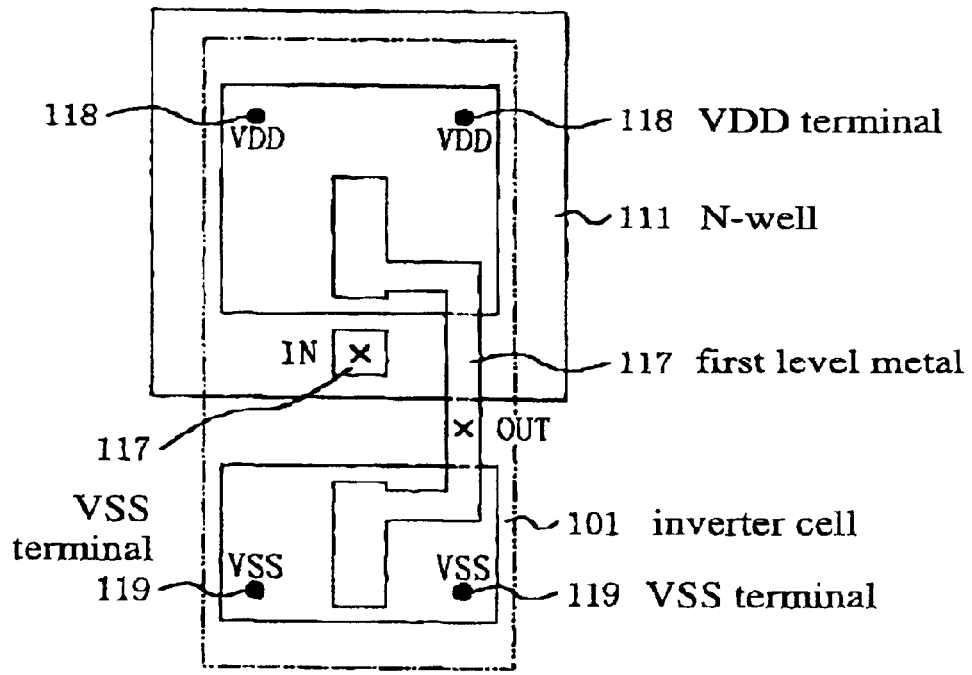

Referring to FIGS. 1A and 1B, there are shown pattern diagrams of an inverter cell which is one embodiment of the standard cell in accordance with the present invention. FIG. 1A illustrates patterns of all levels within an inverter cell 101.

In FIG. 1A, the reference number 111 designates an N-well, and the reference number 112 indicates a P-type diffused layer. The reference number 113 shows an N-type diffused layer, and the reference number 114 denotes a polysilicon. The reference number 115 designates a contact hole between the P-type or N-type diffused layer and a first level metal. The reference number 116 indicates a contact hole between the polysilicon and the first level metal. The reference number 117 shows the first level metal. The reference number 118 denotes a VDD terminal on the P-type diffused layer. The reference number 119 designates a VSS terminal on the N-type diffused layer. In the N-well 111, a P-channel MOS transistor having a source and a drain formed of the P-type diffused layer 112 is formed, and the VDD terminal 118 is formed on the P-type diffused layer 112 which constitutes the source of the P-channel MOS transistor. Similarly, in a P-type substrate region at the outside of the N-well, an N-channel MOS transistor having a source and a drain formed of the N-type diffused layer 113 is formed, and the VSS terminal 119 is formed on the N-type diffused layer 113 which constitutes the source of the N-channel MOS transistor. The P-channel MOS transistor and the N-channel MOS transistor are connected by the first level metal 117 and the contact hole 115, so as to constitute an inverter.

FIG. 1B illustrates only the P-type diffused layer, the N-type diffused layer and the first level metal shown in FIG. 1A. FIG. 1B shows the VDD terminal 118 of the diffused layer, the VSS terminal 119 of the diffused layer, an input terminal IN of the first level metal, and an output terminal OUT of the first level metal. The standard cell in accordance with the present invention is characterized by having the VDD terminal 118 of the diffused layer, the VSS terminal 119 of the diffused layer, the input terminal IN of the first level metal, and the output terminal OUT of the first level metal, without having a metal connection line for a power supply line.

In the standard cell in accordance with the present invention, since the power supply terminal is constituted of the diffused layer, the standard cell is connected to a power supply metal line through a wiring conductor formed of the diffused layer, with the result that it is in some cases that a parasite resistance is inserted between the power supply metal line and the transistor. However, with a recent advanced metal silicide forming technology, a titanium silicide which is formed by depositing a metal titanium (Ti) on a surface of a diffused region and converting the metal titanium into titanium silicide, and a cobalt silicide which is formed by depositing a metal cobalt (Co) on a surface of a diffused region and converting the metal cobalt into cobalt silicide, have been reduced into practice, with the result that a sheet resistance of the diffused layer has been drastically reduced. Therefore, it is possible to minimize the parasitic resistance to a value generating no practical hindrance.

Figure 2A:
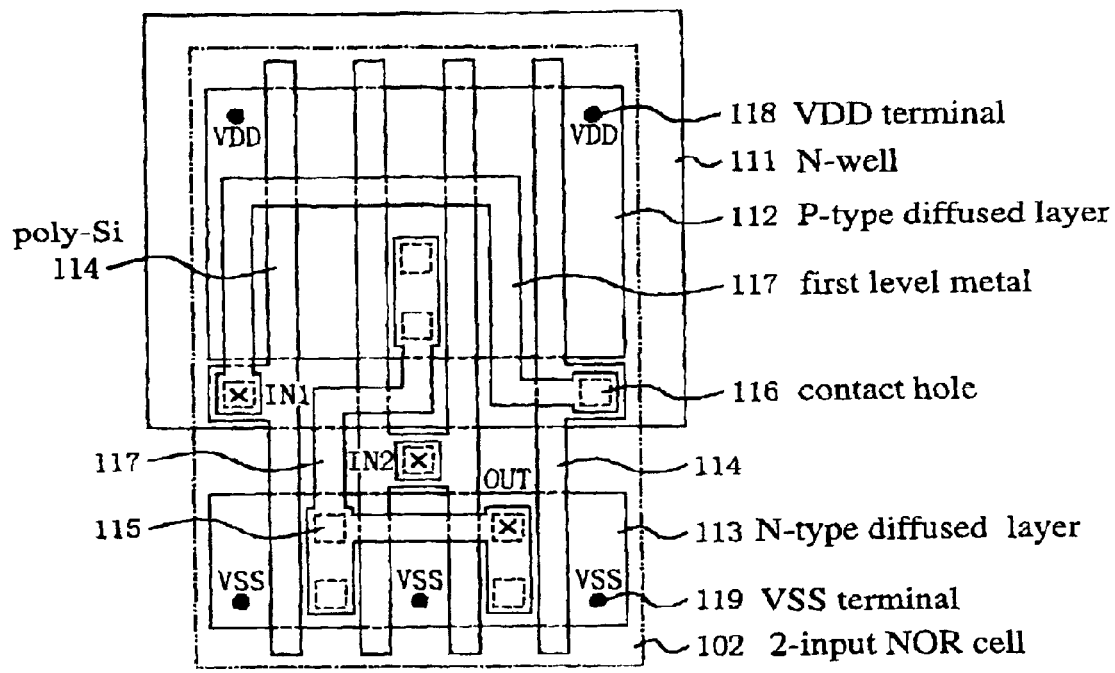
FIG. 2A is a pattern diagram of a 2-input NOR cell which is one embodiment of the standard cell in accordance with the present invention.
Figure 2B:
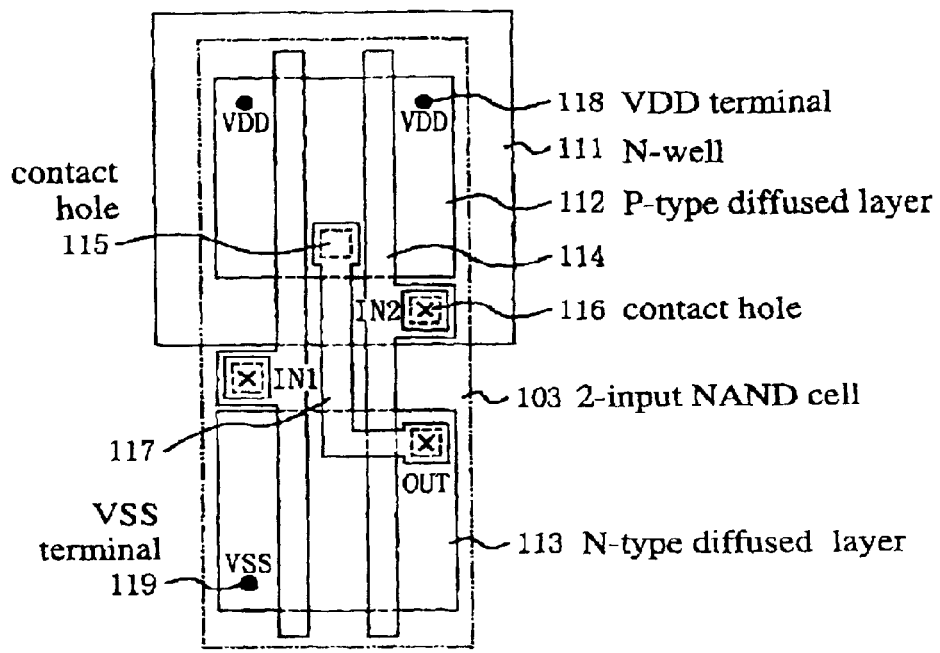
FIG. 2B is a pattern diagram of a 2-input NAND cell which is one embodiment of the standard cell in accordance with the present invention.
Figure 3A:
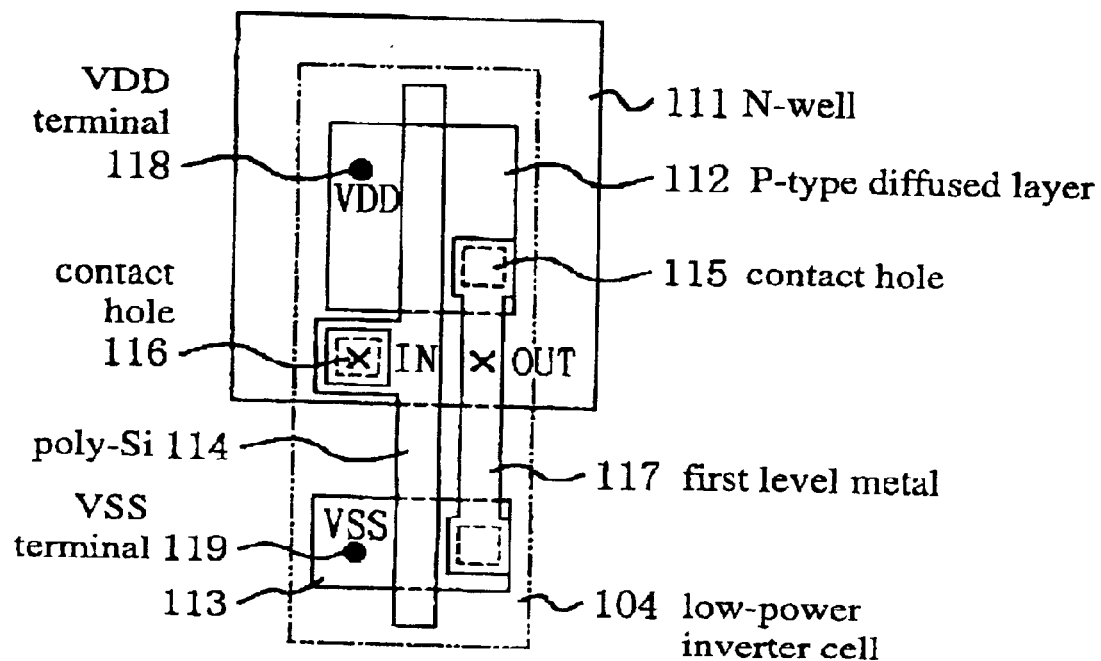
FIG. 3A is a pattern diagram of a low power inverter cell which is one embodiment of the standard cell in accordance with the present invention.
Figure 3B:
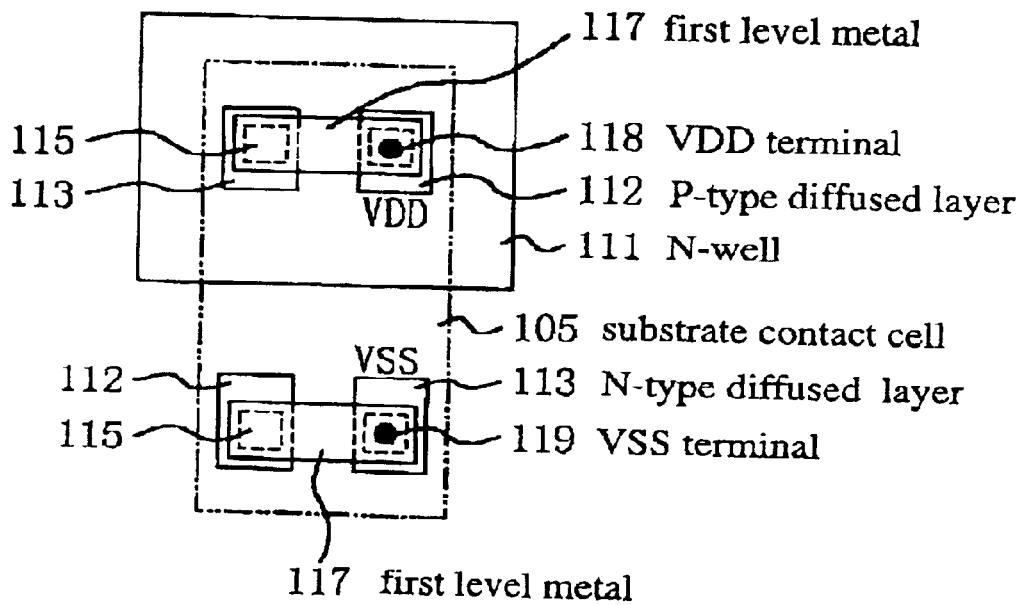
FIG. 3B is a pattern diagram of a substrate contact cell which is one embodiment of the standard cell in accordance with the present invention.

Referring to FIG. 2A, there is shown a pattern diagram of a 2-input NOR cell 102 which is one embodiment of the standard cell in accordance with the present invention. FIG. 2B is a pattern diagram of a 2-input NAND cell 103 which is one embodiment of the standard cell in accordance with the present invention. These standard cells have a pair of input terminals IN1 and IN2. Also, referring to FIG. 3A, there is shown a pattern diagram of a low power inverter cell 104 which is one embodiment of the standard cell in accordance with the present invention. FIG. 3B is a pattern diagram of a substrate contact cell 105 which is one embodiment of the standard cell in accordance with the present invention. In these figures, elements corresponding to those shown in FIGS. 1A and 1B are given the same reference numbers and explanation will be omitted for simplification of description since an averaged person skilled in the art can understand these features with no further explanation. Incidentally, the substrate contact cell 105 is for fixing the potential of the N-well 111 and the potential of the P-type substrate to the VDD potential and the VSS potential, respectively.

As shown in FIGS. 1A, 1B, 2A, 2B, 3A and 3B, the standard cells in accordance with the present invention can have not only different cell lengths but also different cell widths.

Figure 4:
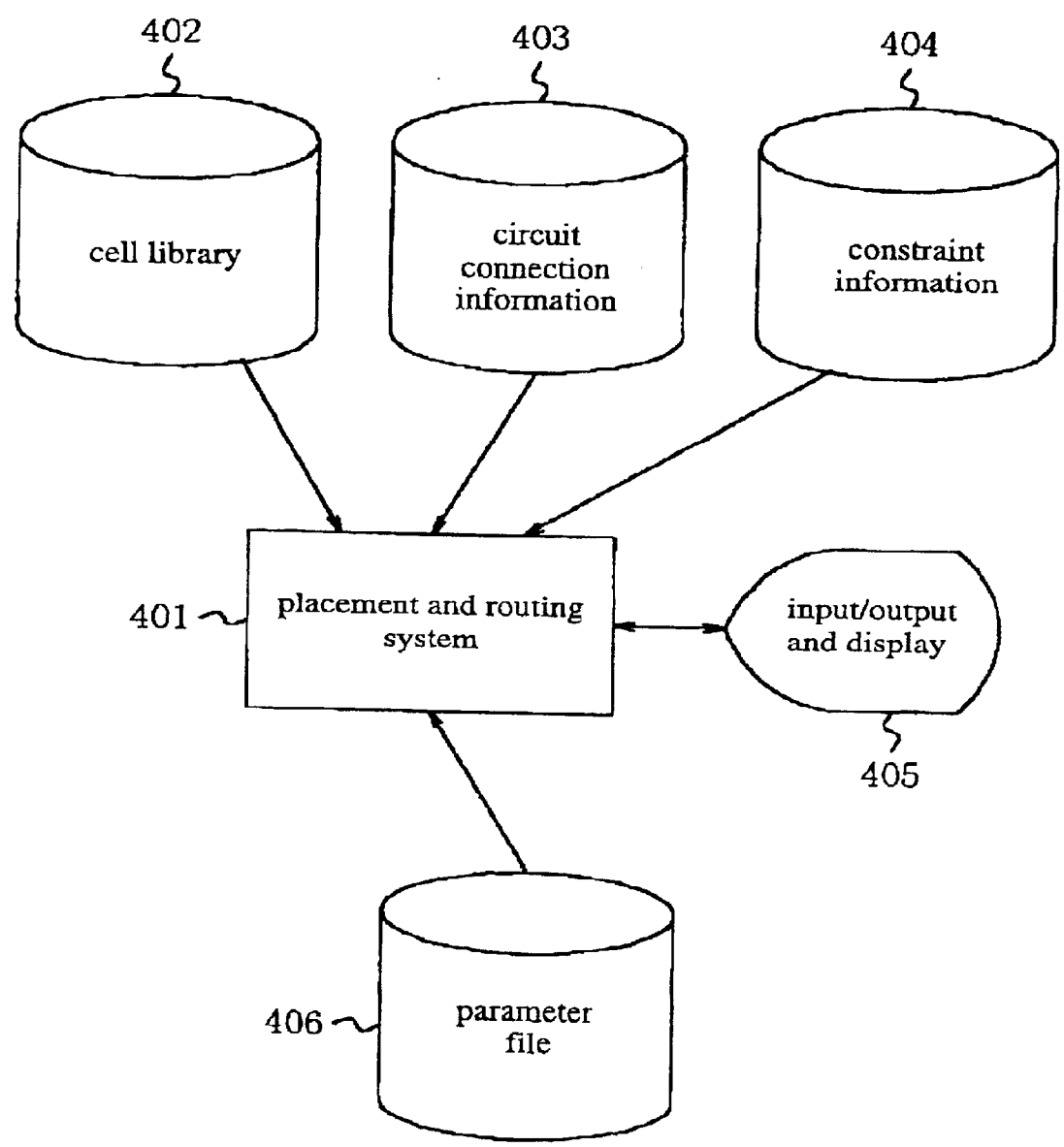
FIG. 4 is a constructional diagram of a processing system in accordance with the present invention for placing and routing standard cells.

Referring to FIG. 4, there is shown a constructional diagram of a standard cell placement and routing processing system in accordance with the present invention for performing the placement and routing by using the standard cells in accordance with the present invention so as to design an LSI.

The design system comprises a placement and routing system 401 for performing the placement of cells and the routing of the inter-cell connections and the power supply lines, a cell library file 402 including the standard cells shown in FIGS. 1A, 1B, 2A, 2B, 3A and 3B, a circuit connection information file 403 for a circuit connection information of the LSI to be developed, a constraint information file 404 storing various constraints concerning the placement and routing, an input/output and display apparatus 405, and a parameter file 406 storing various information including an operating frequency, an operating temperature range, a sheet resistance of a P-type diffused layer, an N-type diffused layer and various interconnection metal layers. The input/output and display apparatus 405 can display the history and the result of the placement and routing, and various commands can be inputted through the input/output and display apparatus 405 to control the execution of the placement and routing.

Now, the placement and routing method executed in the placement and routing system 401 will be described in detail.

Figure 5:
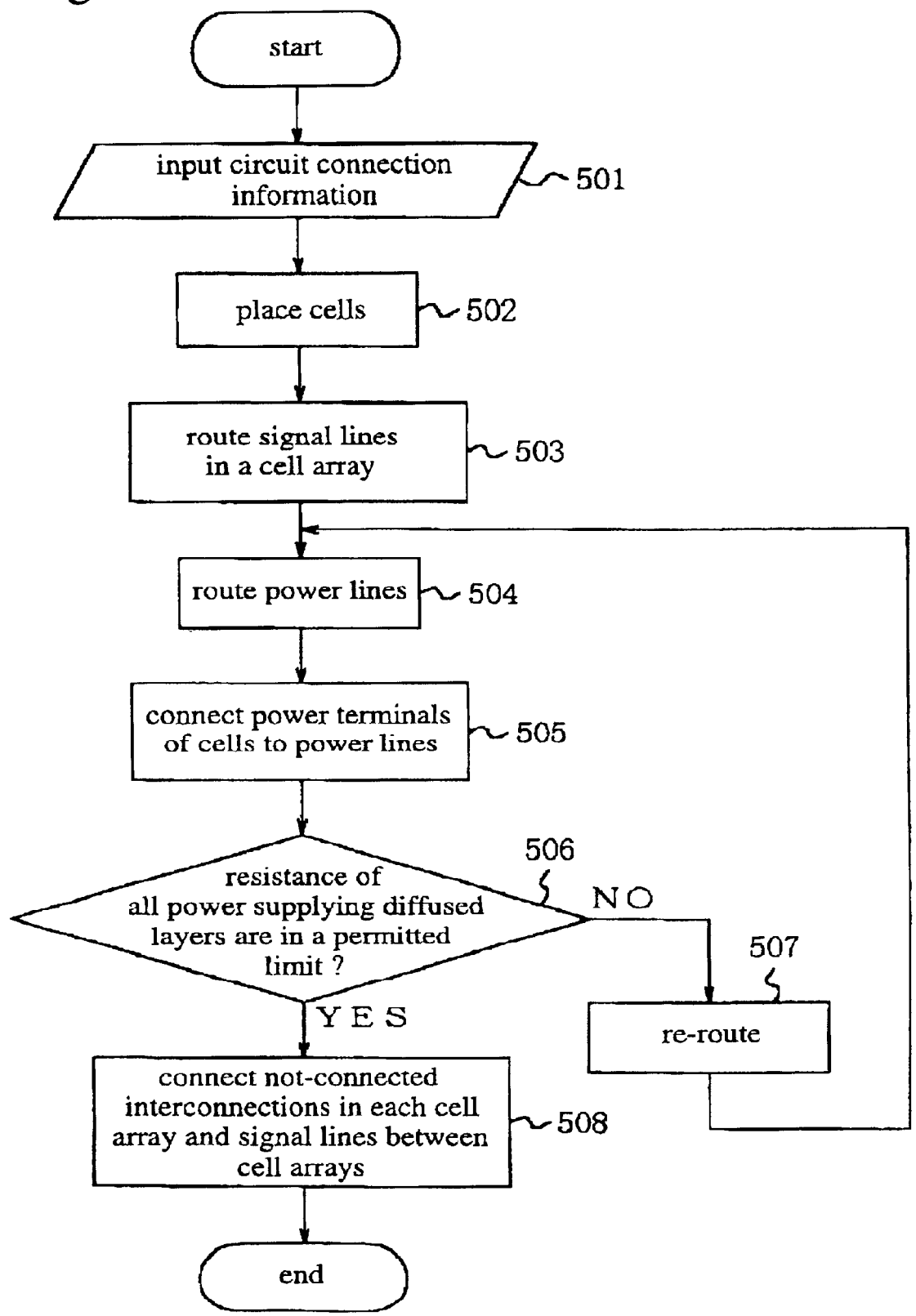
FIG. 5 is a flow chart of one embodiment of the method in accordance with the present invention for placing and routing standard cells.

FIG. 5 is a flow chart of the placement and routing method in accordance with the present invention.

In a step 501, a circuit connection information which represents a circuit of the LSI by small circuits corresponding to cell functions and connection information between the small circuits, is picked up from the circuit connection information file 403 and is inputted to the placement and routing system 401

Figure 6:
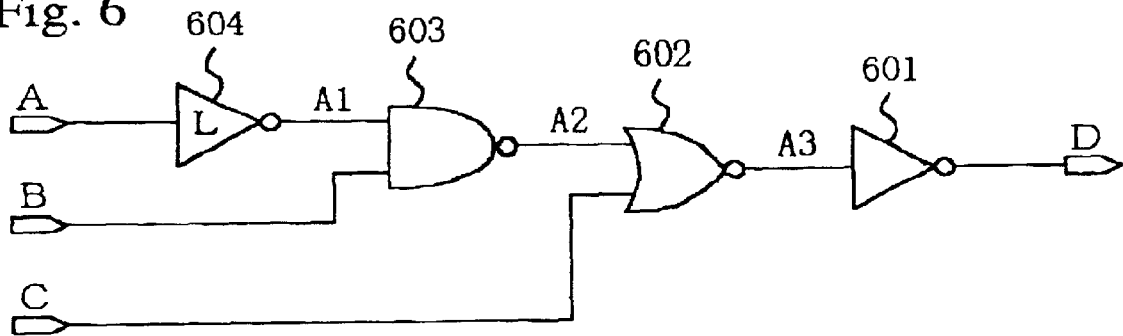
FIG. 6 is a circuit diagram of a circuit used for illustration.

FIG. 6 is a circuit diagram of a circuit example represented by the circuit connection information inputted in the step 501. An input terminal of a low power inverter 604 is connected to a terminal A, and an output terminal of the low power inverter 602 is connected through a connection line A1 to one input terminal of a 2-input NAND circuit 603. The other input terminal of the 2-input NAND circuit 603 is connected to a terminal B, and an output terminal of the 2-input NAND circuit 603 is connected through a connection line A2 to one input terminal of a 2-input NOR circuit 602. The other input terminal of the 2-input NOR circuit 602 is connected to a terminal C, and an output terminal of the 2-input NOR circuit 602 is connected through a connection line A3 to an input terminal of an inverter 601. An output terminal of the inverter is connected to a terminal D. Here, the inverter 601, the 2-input NOR circuit 602, the 2-input NAND circuit 603 and the low power inverter 604 are one small circuit, respectively, and correspond to the inverter cell 101, the 2-input NOR cell 102, the 2-input NAND cell 103 and the low power inverter cell 104, respectively.

In a step 502, standard cells corresponding to the circuit connection information is read out from the cell library file 402, and the read-out standard cells are assorted for each cell array. In each cell array, the standard cells are placed in such a manner that a boundary line of the N-well 111 in the respective standard cells are aligned on one straight line in a plan view.

Figure 7:
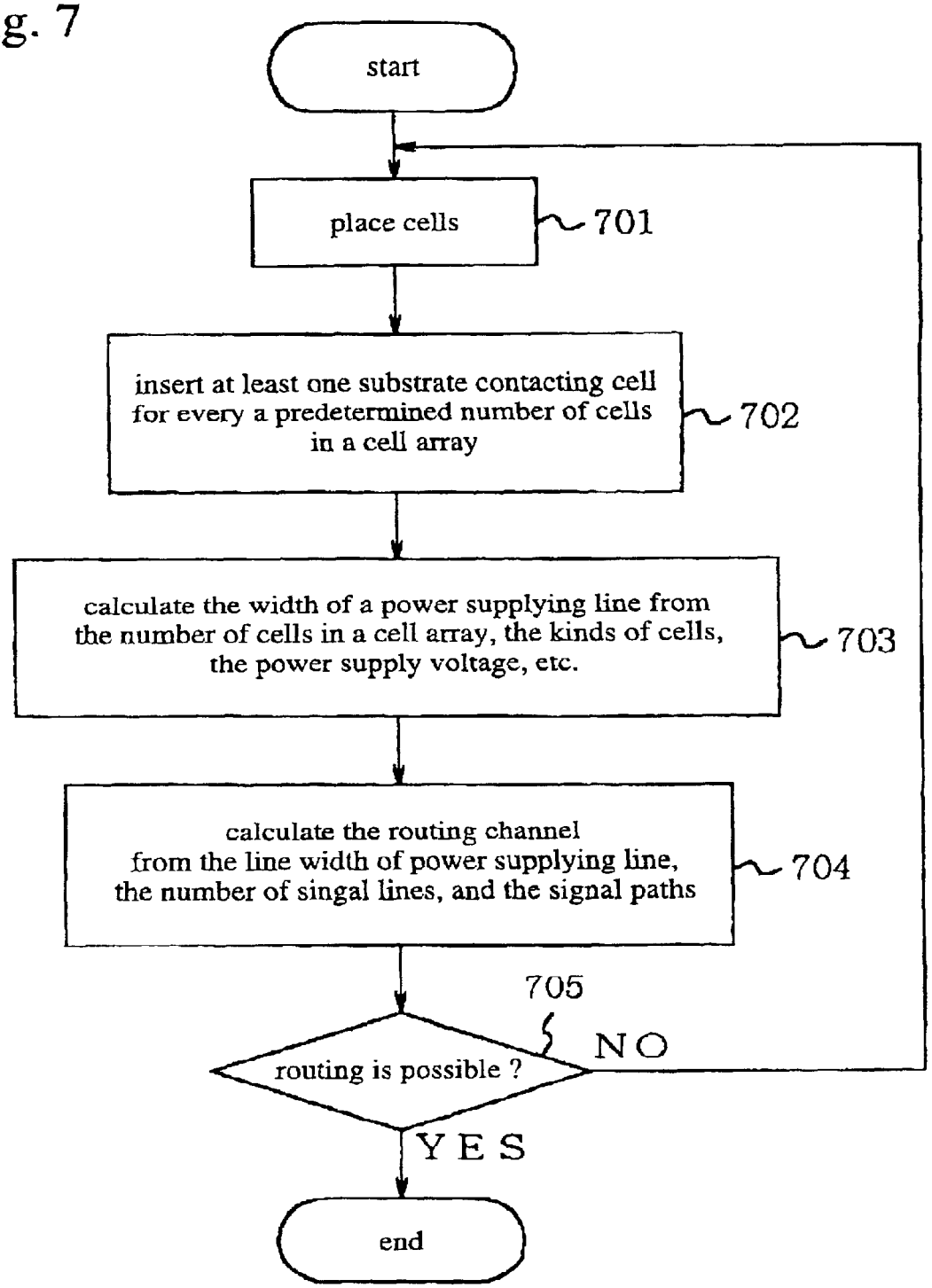
FIG. 7 is a flow chart of the details of the processing in the step 502 shown in FIG. 5.

FIG. 7 is a flow chart showing the details of the processing in the step 502 shown in FIG. 5. In a step 701, a provisional placement order of the small circuits included in the circuit connection information is determined on the basis of the number of interconnection lines between the small circuits and a proximity placement constraint from the constraint information file 404. Then, the standard cells corresponding to the small circuits are read out from the cell library file 402, and the small circuits are replaced by the read-out standard cells, respectively. Furthermore, the length of the cell array and the number of cells included in the cell array are adjusted, and the positions of the read-out standard cells are determined in such a manner that a boundary line of the N-well 111 in the respective standard cells are aligned on one straight line in a plan view. Thus, a provisional cell array is completed.

In a next step 702, in order to stably fix the potential of the N-well in each standard cell to the VDD potential and also to stably fix the potential of the P-type substrate to the VSS potential, at least one substrate contact cell 105 is inserted for every a predetermined number of cells in the provisional cell array, so that a standard cell array is formed.

In a step 703 succeeding to the step 702, an optimum power supply line width for each standard cell array is calculated by considering a heat generation caused by an electric power consumption and an electromigration resistance, which are obtained on the basis of the number of cells and the kinds of cells included in the standard cell array, as well as various information read out from the parameter file 406, including the sheet resistance of the first level metal, the power supply voltage, the operating frequency, and the operating temperature.

Then, in a step 704, a routing channel required between each pair of adjacent standard cell arrays is calculated from the optimum power supply line obtained in the preceding step 703, the number of signal lines between cells, rough signal paths, and the width of wiring enabling areas within the standard cell array.

Thereafter, in a step 705, the chip size of the LSI is estimated from the standard cell arrays and the routing channels thus obtained, and is compared with a vertical size and a horizontal size of the chip stored in the constraint information file 404. If the estimated chip size does not meet with the vertical size and the horizontal size of the chip, the processing returns to the step 701 so that a command is inputted through the input/output and display apparatus 405 to increase or decrease the number of cell arrays for relocation. If the estimated chip size meets with the vertical size and the horizontal size of the chip, the step 502 is completed, and the processing goes to a step 503

Figure 8:
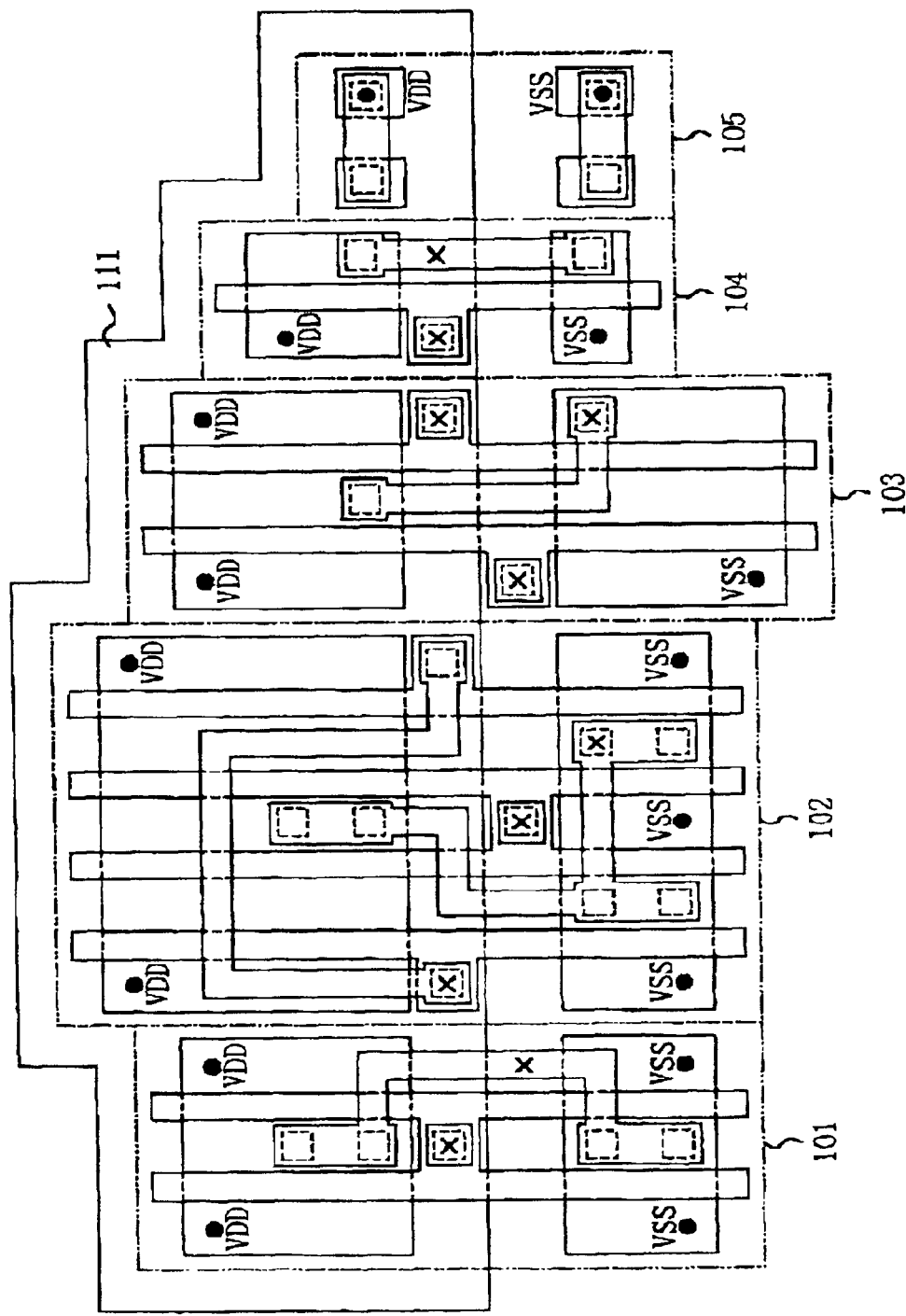
FIG. 8 is a pattern diagram when the processing of the step 502 is completed.

FIG. 8 is a pattern diagram of a portion of the standard cell array when the processing of the step 502 is completed. The inverter cell 101, the 2-input NOR cell 102, the 2-input NAND cell 103 and the low power inverter cell 104, which correspond to the inverter 601, the 2-input NOR circuit 602, the 2-input NAND circuit 603 and the low power inverter 604 shown in FIG. 6, respectively, are closely placed in such a manner that the boundary line of the N-well 111 in the respective standard cells are aligned on one straight line in a plan view, and further, the substrate contact cell 105 is added. The respective N-wells 111 of the standard cells are coupled to form one continuous pattern. In addition, since the respective standard cells have different widths, respectively, the standard cell array shown in FIG. 8 has an upper boundary or contour line and a lower boundary or contour line, both of which are bumpy or unstraight.

Figure 9:
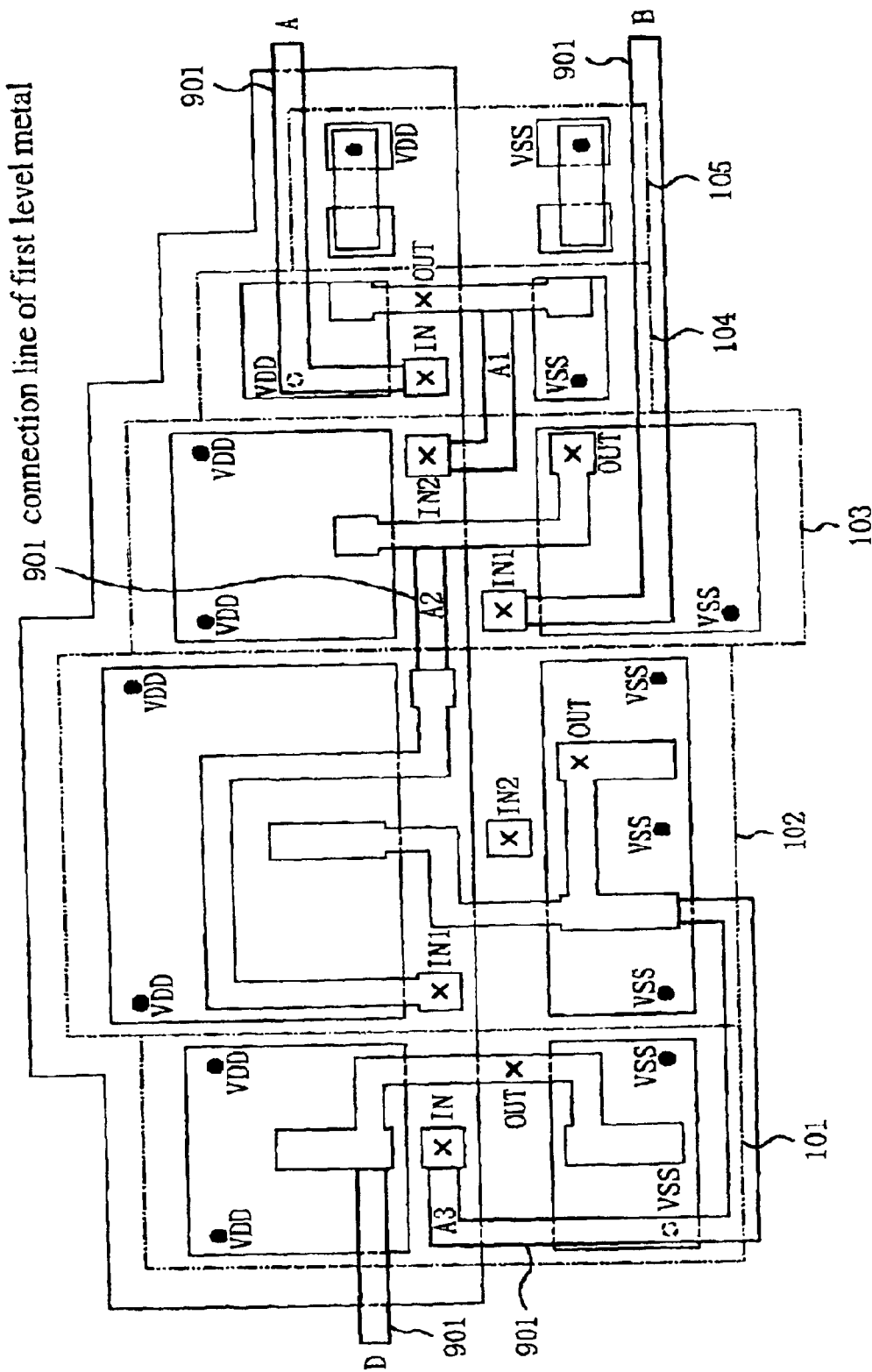
FIG. 9 is a pattern diagram when the processing of the step 503 is completed.

In a step 503, the routing of signal lines in each standard cell array is carried out in accordance with the circuit connection information stored in the circuit connection information file 403. FIG. 9 is a pattern diagram of the same portion of the standard cell array when the processing of the step 503 is completed. In accordance with the circuit connection shown in FIG. 6, the terminal A is connected to the input terminal of the low power inverter cell 104 through an interconnection line 901 of the first level metal. The output terminal of the low power inverter cell 104 is connected to one input terminal of the 2-input NAND cell 103 through an interconnection line 901 (A1) of the first level metal. The terminal B is connected to the other input terminal of the 2-input NAND cell 103 through an interconnection line 901 of the first level metal. The output terminal of the 2-input NAND cell 103 is connected to one input terminal of the 2-input NOR cell 102 through an interconnection line 901 (A2) of the first level metal. The output terminal of the 2-input NOR cell 102 is connected to the input terminal of the inverter cell 101 through an interconnection line 901 (A3) of the first level metal. The output terminal of the inverter cell 101 is connected to the terminal D through an interconnection line 901 of the first level metal. Thus, if the step 503 is completed, the processing goes to a step 504.

Figure 11:
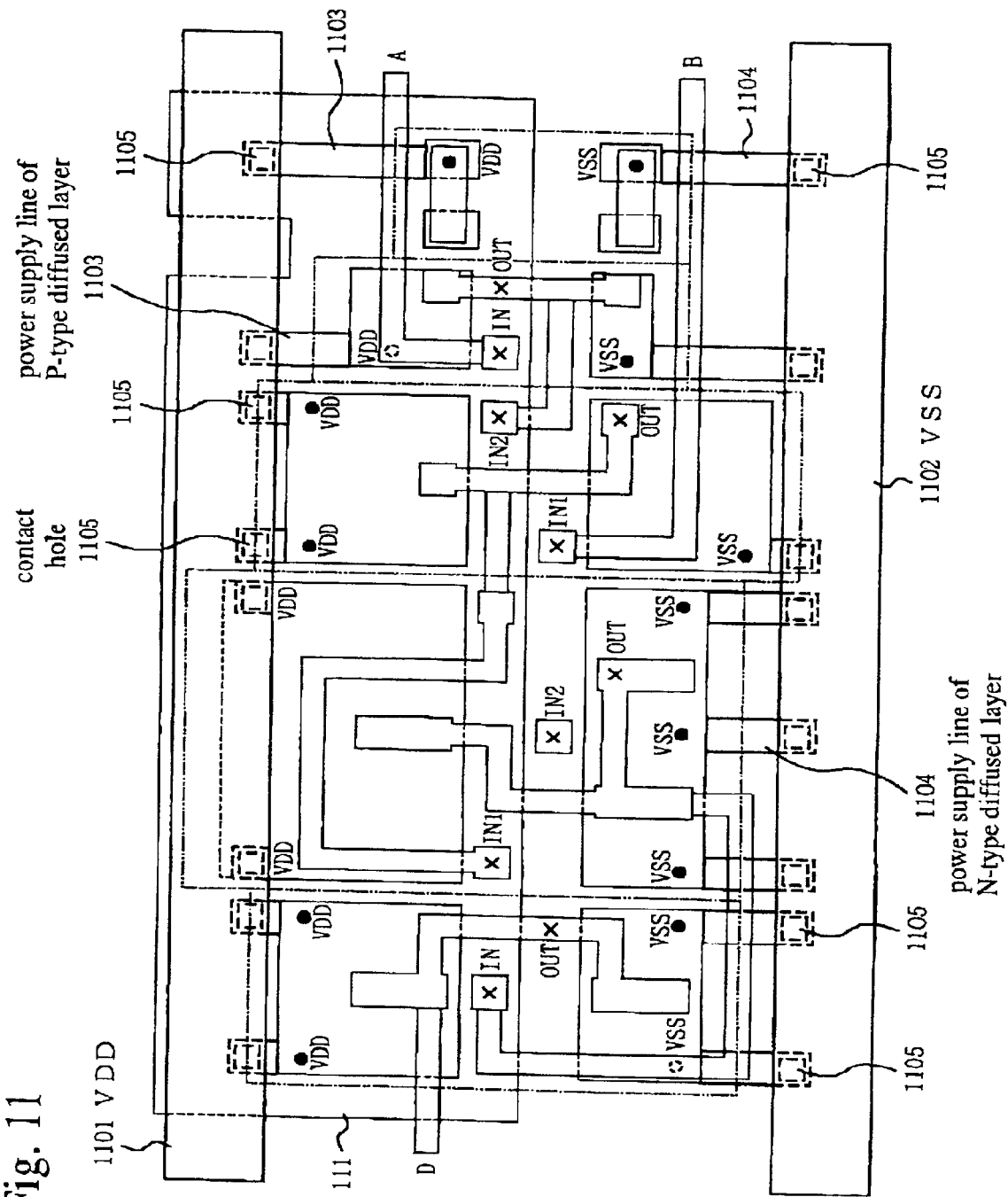
FIG. 11 is a pattern diagram when the processing of the step 505 is completed.

In the step 504, a contour of wiring areas within the standard cell array is extracted, and a power supply line is located at the outside of the contour. Referring to FIG. 11 which is a pattern diagram of the same portion of the standard cell array when the processing of a step 505 is completed, a VDD power supply line 1101 (formed of for example the first level metal) is located at an upper outside of the metal signal lines of the first level metal within the cell array in the plan view, and a VSS power supply line 1102 (formed of for example the first level metal) is located at a lower outside of the metal signal lines of the first level metal within the cell array in the plan view.

Figure 10:
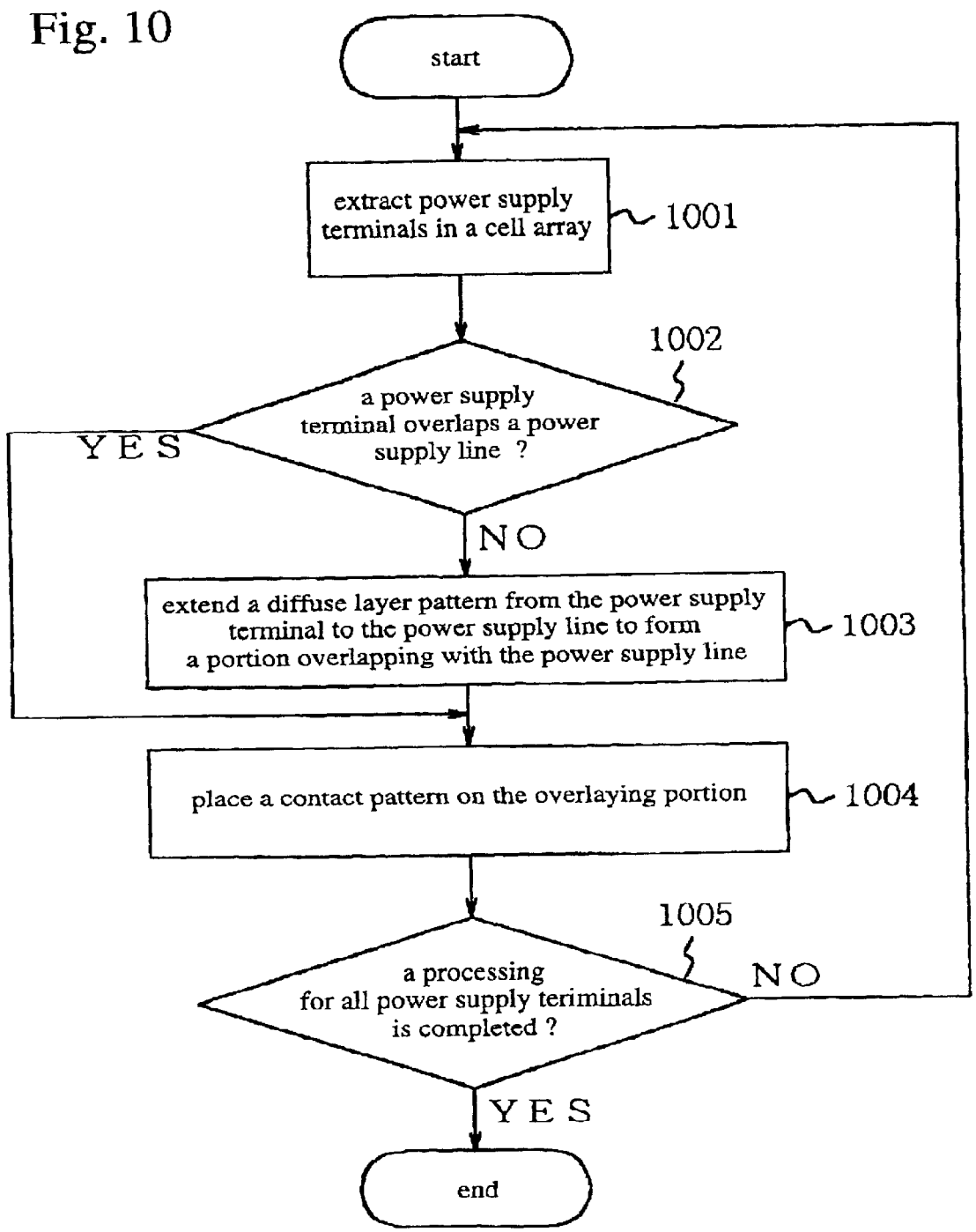
FIG. 10 is a flow chart of the details of the processing in the step 505 shown in FIG. 5.

Then, the processing goes to the step 505, in which the power terminals of each cell are connected to the power supply lines. FIG. 10 is a flow chart of the details of the processing in the step 505. In a step 1001, one standard cell VDD terminal 118 included in the standard cell array is extracted. In a step 1002, whether or not the extracted VDD terminal 118 overlaps the VDD power supply line 1101, is discriminated. If the extracted VDD terminal 118 overlaps the VDD power supply line 1101, the processing goes to a step 1004. On the other hand, if the extracted VDD terminal 118 does not overlap the VDD power supply line 1101, the processing goes to a step 1003, in which a power supply line formed of a P-type diffused layer 1103 (FIG. 11) for supplying the VDD voltage is extended from the VDD terminal 118 towards the VDD power supply line 1101, and also the N-well pattern is extended to surround the power supply line formed of a P-type diffused layer 1103, so that the power supply line formed of the P-type diffused layer 1103 extending from the VDD terminal 118 overlaps the VDD power supply line 1101. After the step 1003 is completed, the processing goes to the step 1004.

In the step 1004, a contact pattern 1105 for interconnecting between the diffused layer and the first level metal is generated and located at an overlapping portion between the VDD power supply line 1101 and the VDD terminal 118 or at an overlapping portion between the VDD power supply line 1101 and the power supply line formed of the P-type diffused layer 1103.

In a next step 1005, whether or not a processing for connecting all the VDD terminals 118 to the VDD power supply line 1101 has been completed, is discriminated. If the connecting processing for all the VDD terminals 118 has not yet been completed, the processing returns to the step 1001. On the other hand, if the connecting processing for all the VDD terminals 118 has been completed, the processing goes to the connecting processing for the VSS terminals 119. This connecting processing for the VSS terminals 119 is similar to the above mentioned connecting processing for the VDD terminals 118, and therefore, can be easily understood from the above description from the steps 1001 to 1005 by replacing the VDD terminal 118, the VDD power supply line 1101 and the power supply line formed of the P-type diffused layer 1103, with the VSS terminal 119, the VSS power supply line 1102 and a power supply line formed of an N-type diffused layer 1104, respectively. If the connecting processing for all the VDD terminals 118 and the VSS terminals 119 has been completed, the processing goes to a step 506.

As mentioned above, FIG. 11 is the pattern diagram of the same portion of the standard cell array when the processing of the step 505 is completed. As shown in FIG. 11, the VDD power supply line 1101 and the VSS power supply line 1102 are located at the outside of an area in which the in-cell wiring lines and the inter-cell connections are located. The contact hole 1105 is formed at the overlapping portion between the VDD terminal 118 and the VDD power supply line 1101. In the VDD terminal 118 that does not overlap the VDD power supply line 1101, the power supply line formed of the P-type diffused layer 1103 is formed to extend from the VDD terminal 118 to the VDD power supply line 1101, and the contact hole 1105 is formed at the overlapping portion between the VDD power supply line 1101 and the power supply line formed of the P-type diffused layer 1103 for the purpose for connecting the VDD power supply line 1101 to the VDD terminal 118 that does not overlap the VDD power supply line 1101. Similarly, the contact hole 1105 is formed at the overlapping portion between the VSS terminal 119 and the VSS power supply line 1102. In the VSS terminal 119 that does not overlap the VSS power supply line 1102, the power supply line formed of the N-type diffused layer 1104 is formed to extend from the VSS terminal 119 to the VSS power supply line 1102, and the contact hole 1105 is formed at the overlapping portion between the VSS power supply line 1102 and the power supply line formed of the N-type diffused layer 1104 for the purpose for connecting the VSS power supply line 1102 to the VSS terminal 119 that does not overlap the VSS power supply line 1102.

In the step 506, whether or not the resistance of the power supply line formed of the P-type diffused layer 1103 and the power supply line formed of the N-type diffused layer 1104 is in a permitted limit, is ascertained. For this purpose, the respective sheet resistance of the P-type diffused layer and the N-type diffused layer are read out from the parameter file 406, and the resistance value is calculated from the width and the length of the diffused layer constituting the power supply line, and is compared with a permissible resistance value stored in the constrain information film 404. If the resistance of all the power supply lines formed of the diffused layer is not greater than the permissible resistance value, the processing goes to a step 508. If the resistance of at least one power supply line formed of the diffused layer is greater than the permissible resistance value, the processing goes to a step 507.

Figure 12:
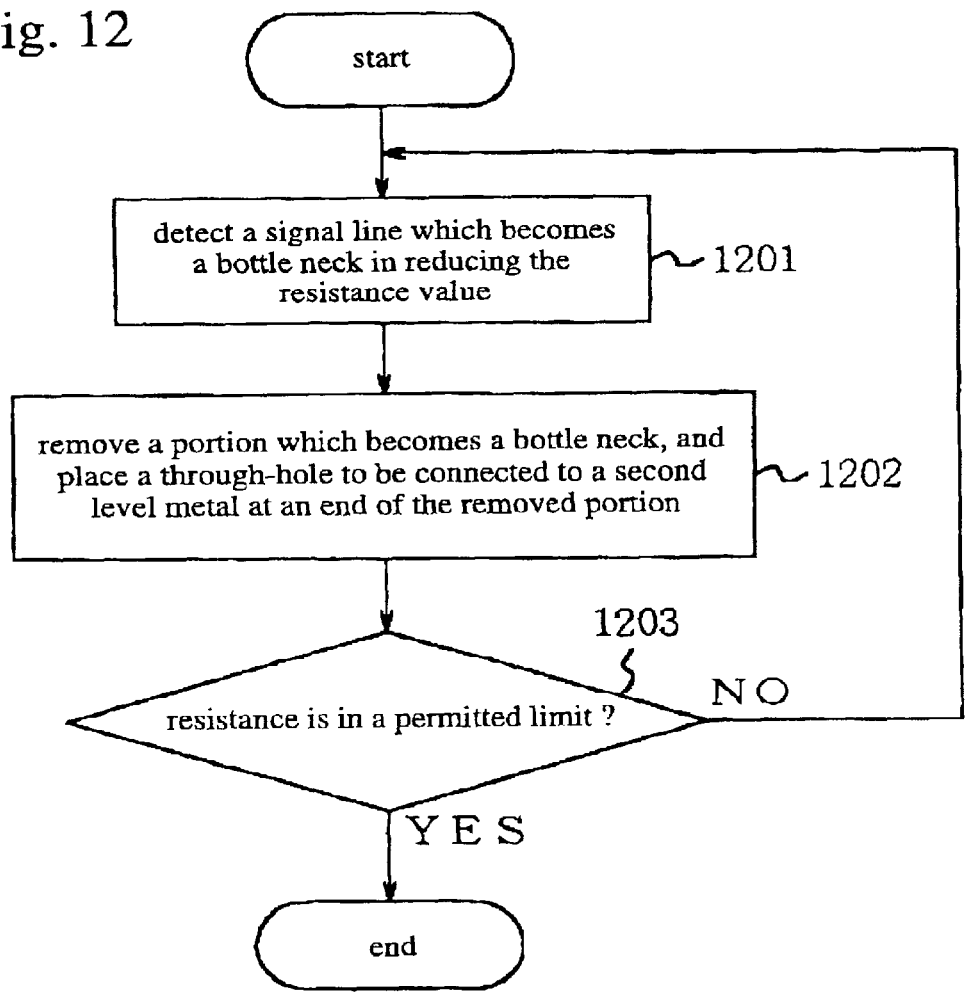
FIG. 12 is a flow chart of the details of the processing in the step 507 shown in FIG. 5.

In the step 507, a re-routing is carried out for making the resistance of all the power supply lines formed of the diffused layer not greater than the permissible resistance value. FIG. 12 is a flow chart of the details of the re-routing processing in the step 507. In a step 1201, the signal line formed of the first level metal which becomes a bottle neck in reducing the resistance of the (first-aimed) power supply line formed of the diffused layer not greater than the permissible resistance value, is detected. In a succeeding step 1202, the signal line formed of the first level metal becoming the bottle neck is removed, and a through-hole for connecting to a second level metal is located at a position to which each end of the removed signal line was connected. At the same time, the corresponding power supply line of the first level metal and the power supply line formed of the diffused layer having the resistance which is greater than the permissible resistance value and which therefore is to be reduced by removing the signal line formed of the first level metal, are removed. In a step 1203 succeeding to the step 1202, the size of the power supply line formed of the diffused layer which can be shortened as the result of the processing in the step 1202, is estimated, and the resistance value of the estimated power supply line is calculated and then compared with the permissible resistance value. If the resistance value is greater than the permissible resistance value, the processing returns to the step 1201. To the contrary, if the resistance value is not greater than the permissible resistance value, the re-routing for the (first-aimed) power supply line formed of the diffused layer having the resistance greater than the permissible resistance value, is completed, and a similar processing is repeated for other power supply lines formed of the diffused layer having the resistance greater than the permissible resistance value. If the re-routing is completed for all the power supply lines formed of the diffused layer having the resistance greater than the permissible resistance value, since all the power supply lines formed of the diffused layer have a resistance not greater than the permissible resistance value, the processing goes to a step 508.

In the step 508, interconnections that have not yet been connected within the cell array, are generated, and signal lines arc connected between the standard cell arrays. Thus, the placement and routing processing is completed.

Figure 13A:
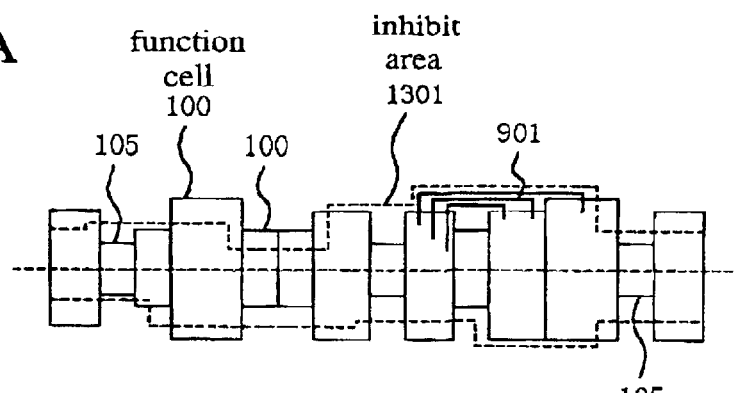
FIGS. 13A, 13B, 13C and 13D are layout diagrams at various steps in the placement and routing process.

FIGS. 13A, 13B, 13C and 13D are layout diagrams illustrating the interconnection condition in the standard cell array at various steps in the placement and routing process. FIG. 13A shows a layout diagram when the step 503 shown in FIG. 5 is completed. The standard cell array comprises a plurality of function cells 100 having different widths and each including a plurality of power supply terminals formed of the diffused layer, and at least one input terminal and one output terminal formed of the first level metal, and at least one substrate contact cell 105 provided for every a predetermined number of function cells. These function cells and the at least one substrate contact cell are placed in the form of an array in such a manner that the boundary line of the N-well in the respective standard cells are aligned on one straight line in a plan view. In addition, interconnections 901 formed of the first level metal are placed for the inter-cell connection. Furthermore, an area of the in-cell wiring and the inter-cell connections (formed of the first level metal) within the standard cell array, is confined as an inhibit area 1301 for inhibiting placement of the power supply line (formed of the first level metal).

Figure 13B:
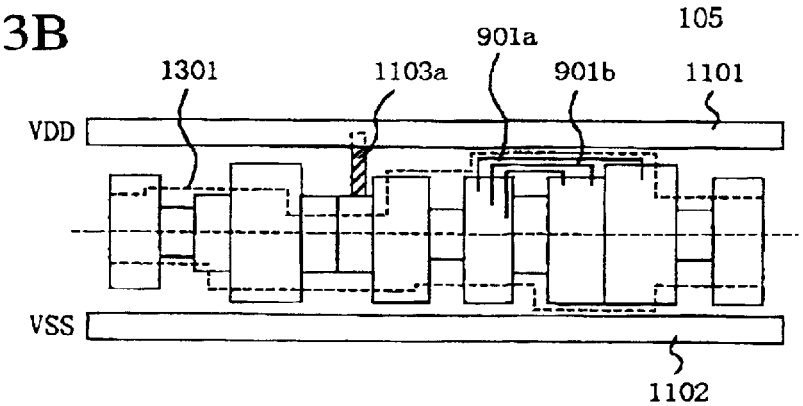

FIG. 13B shows a layout diagram when the step 505 shown in FIG. 5 is completed. The VDD power supply line 1101 and the VSS power supply line 1102 (both of which are formed of the first level metal) are located at the outside of the inhibit area 1301, and the power supply line 1103a formed of the P-type diffused layer is provided. Here, assume that the power supply line 1103a formed of the P-type diffused layer has a resistance greater than the permissible resistance value.

Figure 13C:
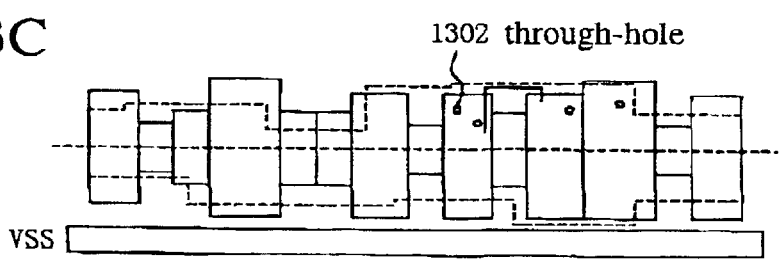

FIG. 13C shows a layout diagram when the step 1202 shown in FIG. 12 is completed in the course of the re-routing processing of the step 507. The power supply line 1103a formed of the P-type diffused layer and the VDD power supply line 1101 are removed, and the interconnections 901a and 901b of the first level metal which become a bottle neck in reducing the resistance of the power supply line 1103a formed of the P-type diffused layer, are removed.

Furthermore, through-holes 1302 are located at end positions of the interconnections 901a and 901b.

Figure 13D:
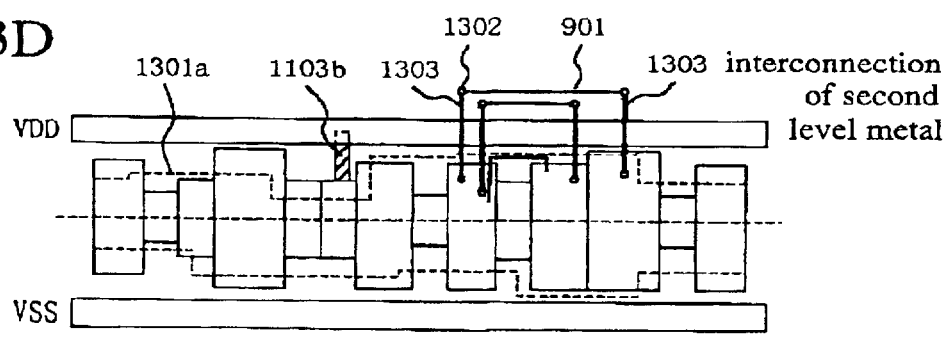

FIG. 13D shows a layout diagram when the step 508 shown in FIG. 5 is completed. The VDD power supply line 1101 is re-placed at the outside of a modified inhibit area 1301a, and in place of the removed interconnections 901a and 901b of the first level metal, interconnections 1303 of a second level metal, the through-holes 1302 and the interconnections 901 of the first level metal are formed so that the interconnections detour to pass at the outside of the VDD power supply line 1101. As a result, a new power supply line 1103b formed of the P-type diffused layer can have a reduced length and therefore a reduced resistance which is in the permissible resistance limit.

Figure 14:
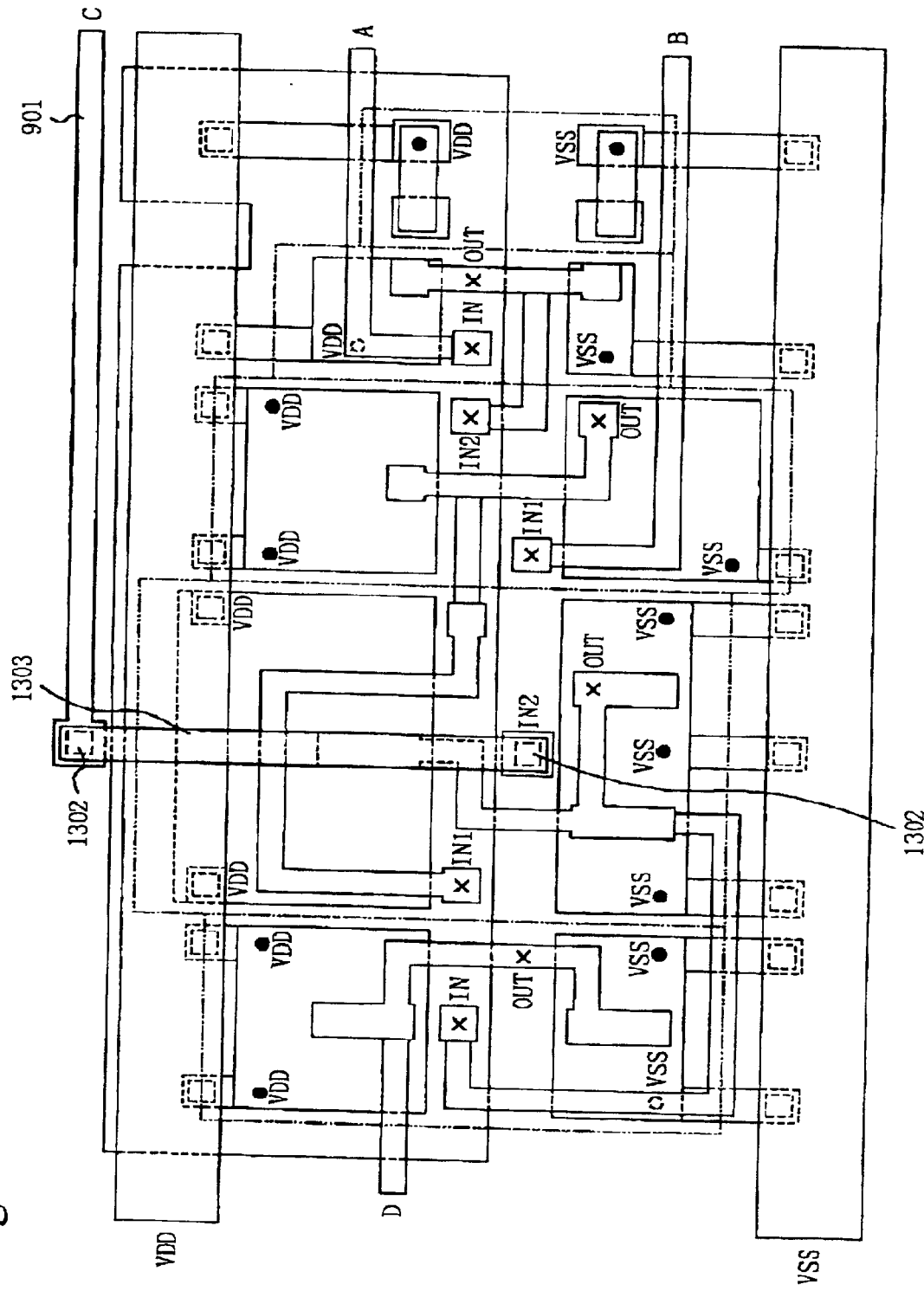
FIG. 14 is a pattern diagram when the processing of the step 508 is completed.

The inter-array connection is also executed in the step 508. FIG. 14 is a pattern diagram when the processing of the step 508 is completed. An inter-array connection is formed by an interconnection line 901 of the first level metal extending from the terminal C, a through-bole 1302 formed at an opposite end of the interconnection line 901 for connecting between the first level metal and the second level metal, an interconnection line 1303 of the second level metal extending from the through-hole 1302 to the other input IN2 of the 2-input NOR cell 102, and a through hole 1302 formed at the position of the second input IN2 for connecting between the first level metal and the second level metal. Thus, the terminal C is connected to the other input IN2 of the 2-input NOR cell 102.

As mentioned above, by forming the standard cell array by using the standard cells in accordance with the present invention, and routing the signal lines and the power supply lines in accordance with the flow chart of FIG. 5, it is possible to place and route standard cells having different widths with no hindrance, and it is also possible to set the width of the power supply line (of metal) to an appropriate width for each standard cell array. In addition, the device formation region can be utilized as a routing channel. Therefore, a high wiring density can be realized.

Figure 15:
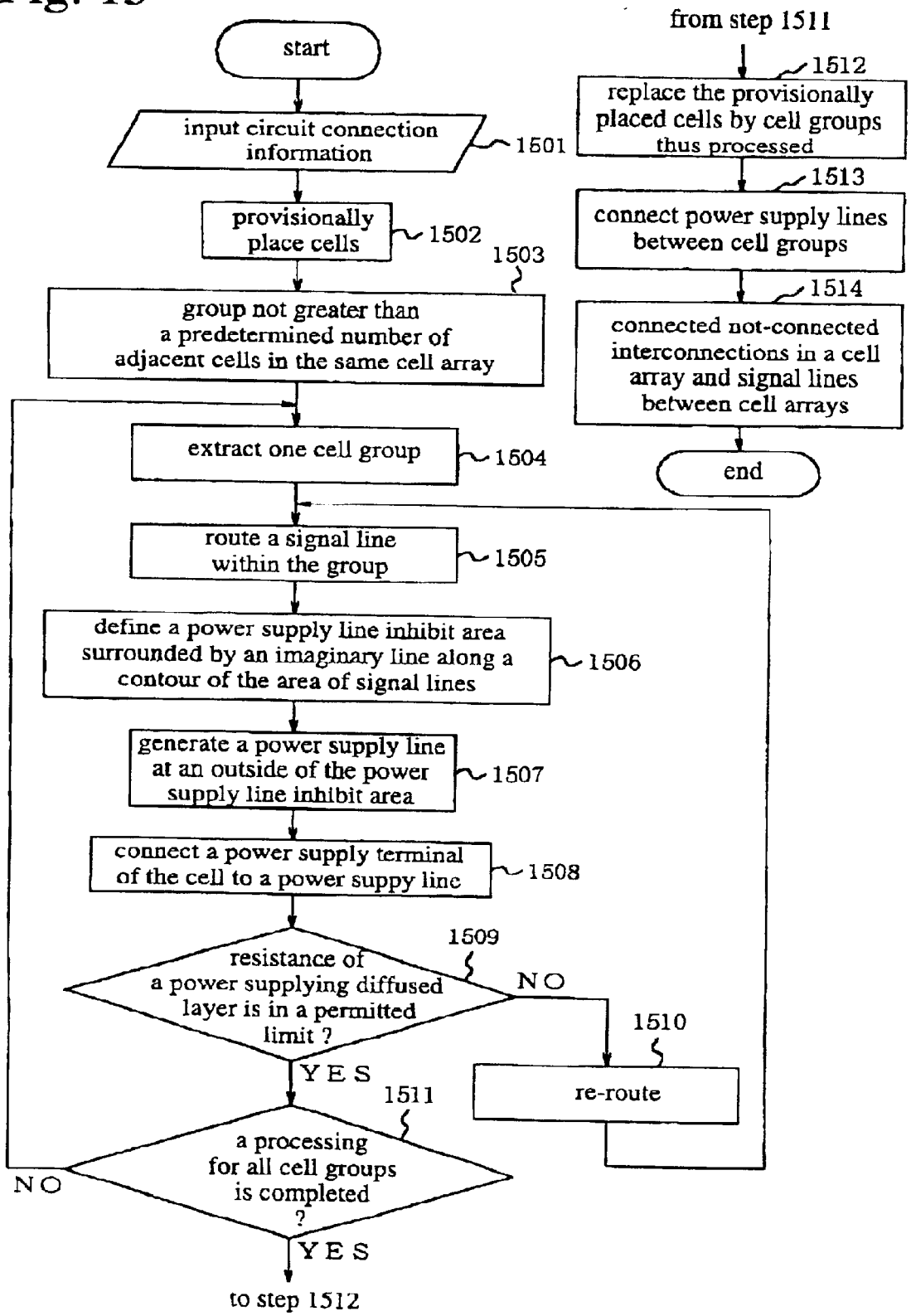
FIG. 15 is a flow chart of another embodiment of the method in accordance with the present invention for placing and routing standard cells.

Referring to FIG. 15, there is shown a flow chart of another embodiment of the method in accordance with the present invention for placing and routing standard cells. This second embodiment is different from the first embodiment in that, before forming the cell array, cell groups each including a plurality of cells of not greater than a predetermined number are formed, and in each cell group, the inter-cell connection and the power supply lines are placed and routed, and thereafter, the cell groups are coupled to form a cell array, and inter-group connections are executed.

In a step 1501, circuit connection information is inputted. Then, in a step 1502, cells are provisionally placed to form a provisional cell array. In a step 1503, the provisional cell array is divided into a plurality of cell groups each consisting of not greater than a predetermined number of cells located adjacent one another in the same provisional cell array. At this time, it is possible to modify the circuit connection information in accordance with to the cell groups thus obtained, and to store the modified circuit connection information in the circuit connection information file 403.

Thereafter, the processing goes into a step 1504, in which one cell group is extracted. Then, in a step 1505, the standard cells included in the extracted cell group are read out from the cell library 402, and placed on the basis of a provisional placement information. In addition, at least one substrate contact cell is added, and the inter-cell connection is executed.

Next, the processing goes into a step 1506, in which a power supply line inhibit area surrounded by an imaginary line along the contour of an area of signal lines within the cell group is extracted, and then, stored in the constraint information file. In a step 1507, an optimum width of a power supply line (formed of metal) is calculated on the basis of the information stored in the constraint information file 404 and the parameter file 406, to generate a power supply line at the outside of the inhibit area. The power supply line may extend in a straight line but may be bent to extend along the contour of the inhibit area.

Thereafter, the processing goes into a step 1508, in which the power supply terminals of the standard cells included in the cell group are connected to the power supply lines. When the power supply terminal overlaps the power supply line, a contact hole is generated at an overlapping position between the power supply line and the power supply terminal. If the power supply terminal does not overlap the power supply line (formed of metal), a power supply line of a diffused layer is extended from the power supply terminal to overlap the power supply line (formed of metal), and a contact hole is generated at an overlapping position between the power supply line (formed of metal) and the power supply line of the diffused layer.

In a step 1509, whether or not the resistance value of the power supply line of the diffused layer extending from the power supply terminal is in a permissible limit, is discriminated. If the resistance is greater than a permissible value, the processing goes into a step 1510, in which a processing similar to the flow chart shown in FIG. 12 is executed for re-routing. If the step 1510 is completed, the processing returns to the step 1505. When the resistance of all the power supply lines of the diffused layer is in the permissible limit, namely, not greater than the permissible value, it is considered that the placement and routing processing for the cell group concerned has been completed, and the processing goes into a step 1511.

In the step 1511, whether or not the placement and routing processing for all the cell groups has been completed, is discriminated. If the placement and routing processing for all the cell groups has not yet been completed, the processing returns to the step 1504. On the other hand, if the placement and routing processing for all the cell groups has been completed, the processing goes into a step 1512.

In the step 1512, the provisionally placed cells in the provisional cell array are replaced with the cell groups processed mentioned above. In a next step 1513, the power supply lines are connected between the cell groups. Thereafter, in a step 1514, interconnections that have not yet been connected within the cell array, are generated, and signal lines are connected between the standard cell arrays. Thus, the placement and routing processing is completed.

Figure 16A:
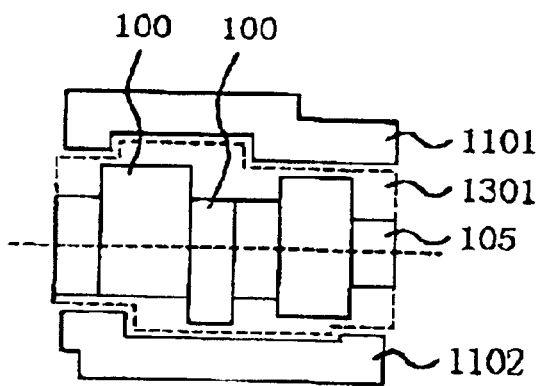
FIGS. 16A, 16B and 16C are layout diagrams of various cell groups.
Figure 16B:
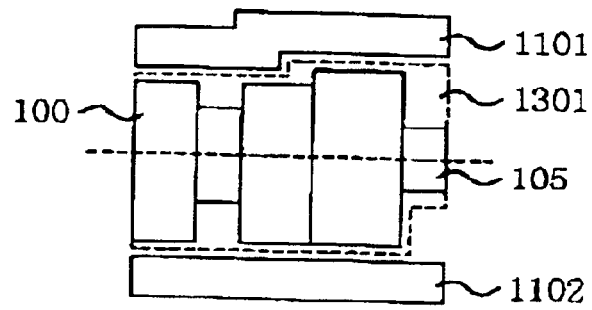
Figure 16C:
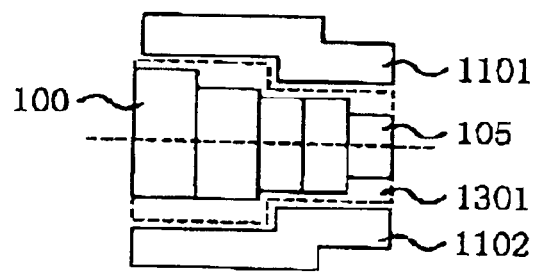
Figure 16D:
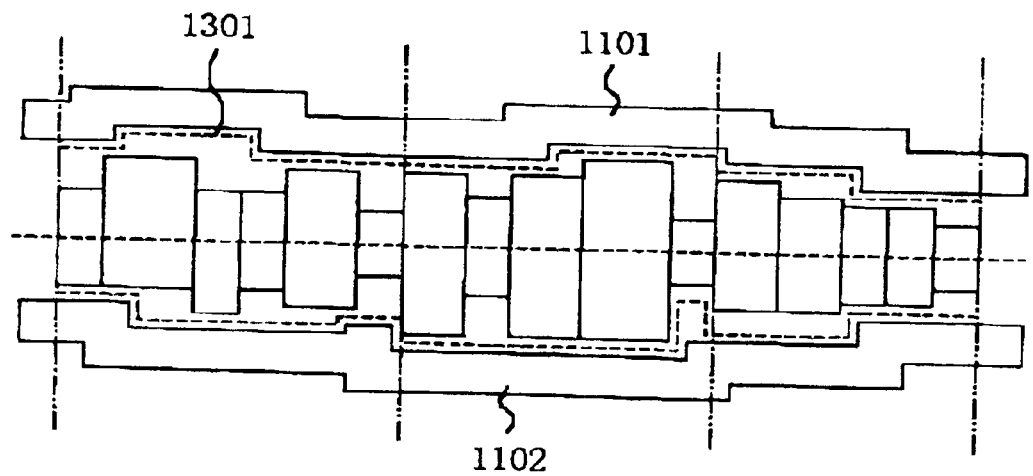
FIG. 16D is a layout diagram of the standard cell array constituted of various cell groups.

FIGS. 16A, 16B and 16C are layout diagrams of various cell groups. Each of the cell groups shown in FIGS. 16A, 16B and 16C includes a plurality of function cells 100 and one substrate contact cell 105 which are closely placed in such a manner that the boundary line of the N-well in the respective standard cells are aligned on one straight line in a plan view. An inhibit area 1301 is confined to surround a wiring area of the signal lines within the cell group, and the VDD power supply line 1101 and the VSS power supply line 1102 are placed to extend along the outside of the inhibit area 1301. FIG. 16D is a layout diagram of the standard cell array obtained by coupling the cell groups shown in FIGS. 16A, 16B and 16C.

Figure 17:
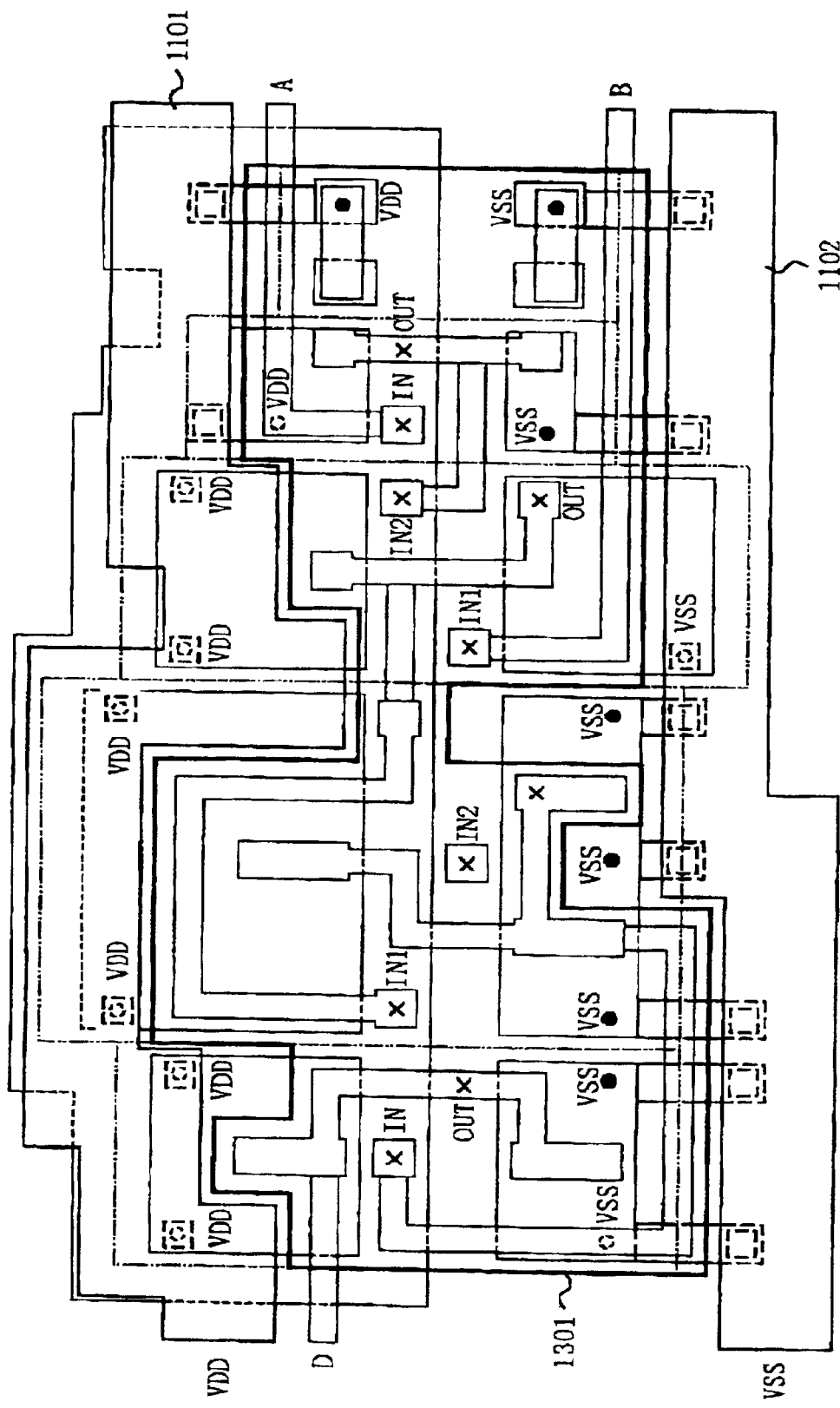
FIG. 17 is a pattern diagram when the processing of the step 1508 is completed.
Figure 18A:
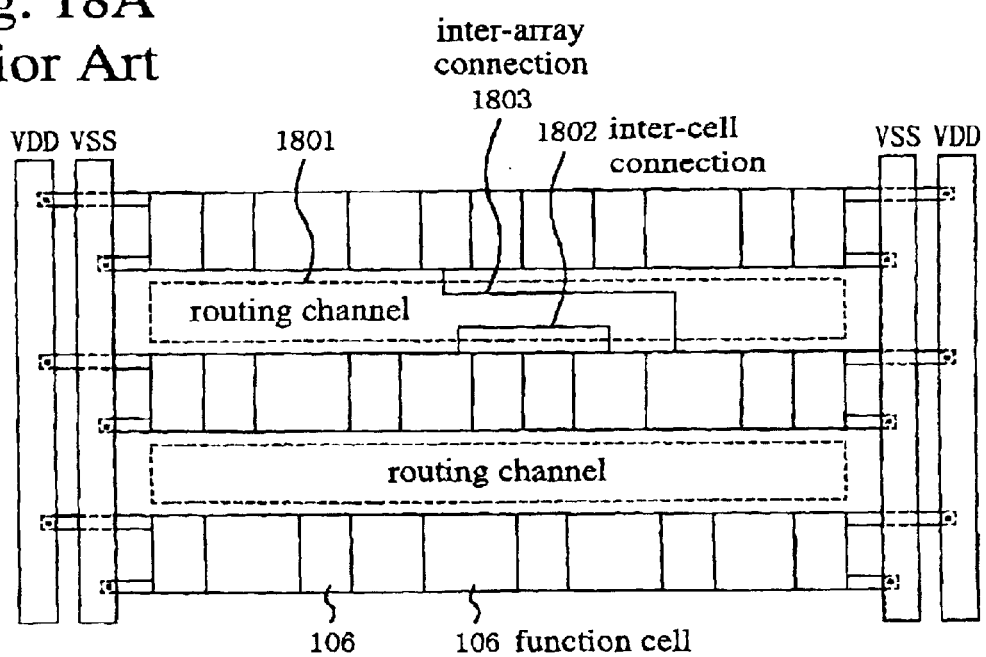
FIG. 18A is a layout diagram of a standard cell type LSI.
Figure 18B:
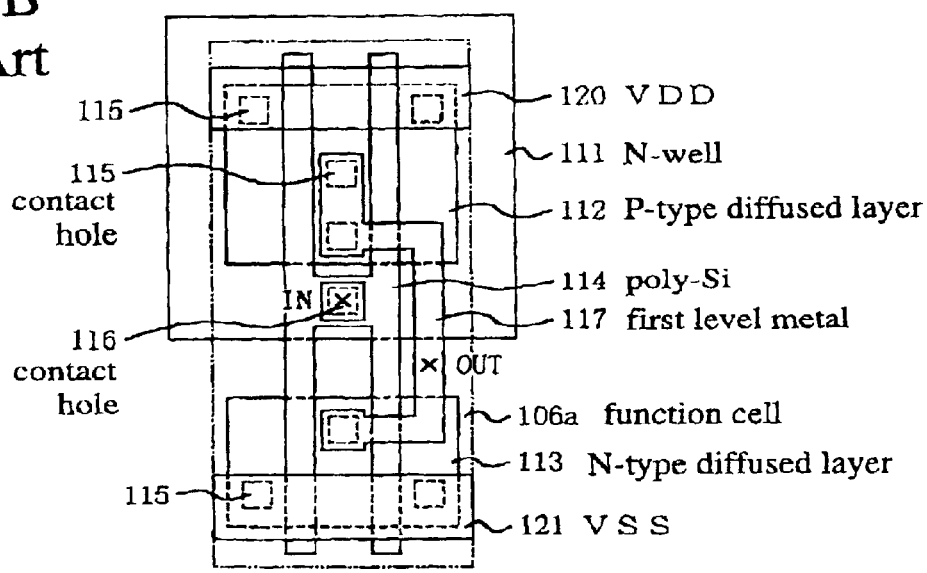
FIG. 18B is a pattern diagram of a first prior art standard cell example.
Figure 19A:
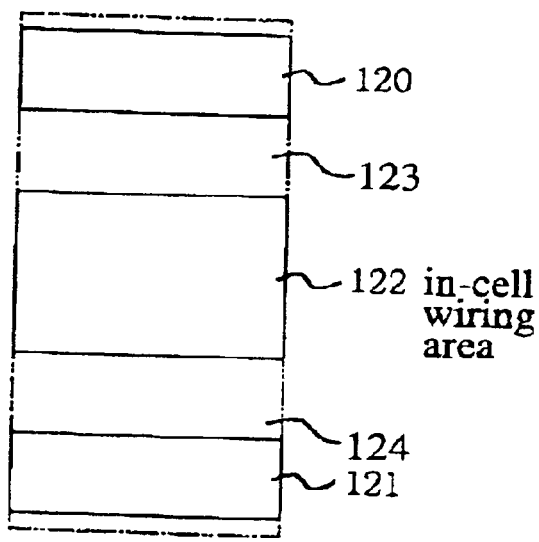
FIGS. 19A, 19B and 19C are wiring area diagrams of second, third and fourth prior art standard cell examples.
Figure 19B:
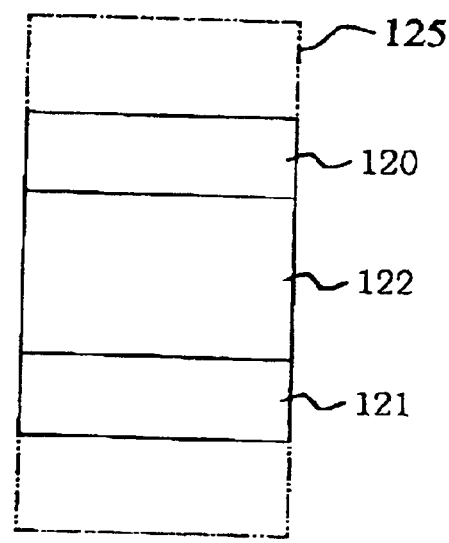
Figure 19C:
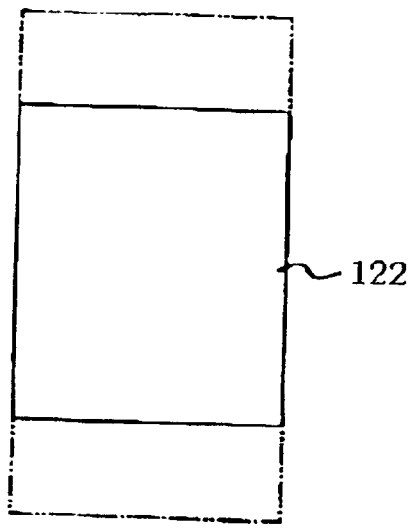

FIG. 17 is a pattern diagram of one cell group when the processing of the step 1508 is completed. The power supply line inhibit area 1301 (surrounded by a thick solid line in FIG. 17) is confined to surround the internal wiring area. The VDD power supply line 1101 is placed in a bent form to extend along the upper outside of the inhibit area 1301 in a plan view, and the VSS power supply line 1102 is placed in a bent form to extend along the lower outside of the inhibit area 1301 in a plan view. Because of the bent power supply lines, a further high wiring density can be realized, and also, the power supply line formed of the diffused layer for connecting between the power supply terminal and the power supply line (formed of metal) can be shortened in comparison with the pattern diagram shown in FIG. 11. Therefore, the number of the power supply lines formed of the diffused layer having the resistance greater than the permissible value, which are detected in the step 1509, can be reduced, with the result that efficiency of the placement and routing can be elevated.

As mentioned above, by forming the standard cell array by using the standard cells in accordance with the present invention, and routing the signal lines and the power supply lines in accordance with the present invention, it is possible to place and route standard cells having different widths with no hindrance, and it is also possible to utilize the device formation region between the power supply line and the wiring area within the cell, as a routing channel. As a result, a high wiring density can be realized. In addition, it is possible to set the width of the power supply line (of metal) to an appropriate width for each standard cell array.

The invention has thus been shown and described with reference to the specific embodiments. However, it should be noted that the present invention is in no way limited to the details of the illustrated structures but changes and modifications may be made within the scope of the appended claims.

What is claimed is:

1. A standard cell placement and routing processing system comprising a library file which stores information of various standard cells each of which comprises a power supply terminal of a diffused layer, an input terminal of a first level metal and an output terminal of said first level metal, a circuit connection information file which stores circuit connection information of an LSI to be developed, a constraint information file which stores constraint information concerning the placement and the routing, a parameter file which stores parameter information including a power supply voltage and an operating frequency of said LSI to be developed and a sheet resistance of said diffused layer, a placement and routing system for executing the placement and the routing of standard cells selected in accordance with the circuit connection information from said circuit connection information file, by utilizing information from said library file, said constraint information file and said parameter file, and an input/output and display apparatus for displaying a history and a result of the placement and the routing and for externally inputting a control command to control said placement and routing system;

wherein said placement and routing system detects a signal line which becomes a hindrance in reducing the resistance of a power supply line, removes said signal line, and locates a connection path between said first level metal and a second level metal at an end position to which the removed signal line was connected.

2. A standard cell placement and routing method for executing a placement and routing of standard cells by using a standard cell placement and routing processing system which comprises a library file which stores information of various standard cells each of which comprises a power supply terminal of a diffused layer, an input terminal of a first level metal and an output terminal of said first level metal, a circuit connection information file which stores circuit connection information of an LSI to be developed, a constraint information file which stores constraint information concerning the placement and the routing, a parameter file which stores parameter information including a power supply voltage and an operating frequency of said LSI to be developed and a sheet resistance of said diffused layer, a placement and routing system for executing the placement and the routing of standard cells selected in accordance with the circuit connection information from said circuit connection information file, by utilizing information from said library file, said constraint information file and said parameter file, and an input/output and display apparatus for displaying a history and a result of the placement and the routing and for externally inputting a control command to control said placement and routing system, the method comprising:

a first step of reading out said circuit connection information from said circuit connection information file;

a second step of reading out from said cell library file, standard cells corresponding to the read-out circuit connection information, and locating the read-out standard cells into a plurality of standard cell arrays, each of said plurality of standard cell arrays including at least one substrate contact cell inserted for every a predetermined number of standards cells, and said standard cells included in each of said plurality of standard cell arrays being arranged in such a manner that respective well boundary lines within the standard cells in each standard cell array are aligned on one straight line in a plan view;

a third step of routing signal lines between the standard cells included in said standard cell array, in accordance with said circuit connection information;

a fourth step of extracting a contour of a wiring area of said signal lines within said standard cell array, and placing a power supply line at the outside of said wiring area;

a fifth step of forming a contact hole at an overlapping portion between said power supply line and said power supply terminal of said diffused layer within said standard cell in said standard cell array, or alternatively, extending a power supply line of said diffused layer from said power supply terminal to said power supply line when said power supply terminal does not overlap said power supply line, and then, forming a contact hole at an overlapping portion between said power supply line and said power supply line of said diffused layer;

a sixth step of discriminating whether or not the resistance of said power supply line of said diffused layer is not greater than a predetermined resistance value stored in said constraint information file;

a seventh step of re-routing said signal lines between said standard cells when it is discriminated in said sixth step that the resistance of said power supply line of said diffused layer is greater than said predetermined resistance value, and then, returning to said fourth step; and an eighth step of routing a not-connected interconnection in said standard cell array and signal lines between said standard cell arrays when it is discriminated in said sixth step that the resistance of said power supply line of said diffused layer is not greater that said predetermined resistance value.

3. A method claimed in claim 2 wherein said second step includes:

a first sub-step of reading out from said cell library file, said standard cells corresponding to the read-out circuit connection information, and locating said read-out standard cells into a plurality of standard cell arrays in such a manner that respective well boundary lines within the standard cells in each standard cell array are aligned on one straight line in a plan view;

a second sub-step of inserting said at least one substrate contact cell for every a predetermined number of standards cells in each standard cell array, to complete said plurality of standard cell arrays;

a third sub-step of calculating a power supply line width on the basis of information including the number of the standard cells and the kinds of the standard cells included said standard cell array, said power supply voltage, and said operating frequency;

a fourth sub-step of calculating the width of a routing channel required from said power supply line width, the number of signal lines, and signal paths; and a fifth sub-step of discriminating whether or not the routing is possible, with reference to a chip size stored in said constraint information file, and returning to said first sub-step when the routing is not possible, and on the other hand, completing said second step when the routing is possible.

4. A method claimed in claim 2 wherein said fifth step includes:

a first sub-step of extracting said power supply terminals of said standard cells included in said standard cell array;

a second sub-step of discriminating whether or not the extracted power supply terminal overlaps said power supply line;

a third sub-step of extending said power supply line of said diffused layer from said extracted power supply terminal to said power supply line when said extracted power supply terminal does not overlap said power supply line, so that said power supply line of said diffused layer overlaps said power supply line; and a fourth sub-step of forming a contact hole at an overlapping portion between said extracted power supply terminal and said power supply line when it is discriminated in said second sub-step that said extracted power supply terminal overlaps said power supply line, or alternatively at an overlapping portion between said power supply line and said power supply line of said diffused layer when it is discriminated in said second sub-step that said extracted power supply terminal does not overlap said power supply line.

5. A standard cell placement and routing method for executing a placement and routing of standard cells by using a standard cell placement and routing processing system which comprises a library file which stores information of various standard cells each of which comprises a power supply terminal of a diffused layer, an input terminal of a first level metal and an output terminal of said first level metal, a circuit connection information file which stores circuit connection information of an LSI to be developed, a constraint information file which stores constraint information concerning the placement and the routing, a parameter file which stores parameter information including a power supply voltage and an operating frequency of said LSI to be developed and a sheet resistance of said diffused layer, a placement and routing system for executing the placement and the routing of standard cells selected in accordance with the circuit connection information from said circuit connection information file, by utilizing information from said library file, said constraint information file and said parameter file, and an input/output and display apparatus for displaying a history and a result of the placement and the routing and for externally inputting a control command to control said placement and routing system, the method comprising:

a first step of reading out said circuit connection information from said circuit connection information file;

a second step of reading out from said cell library file, standard cells corresponding to the read-out circuit connection information, and locating the read-out standard cells into a plurality of standard cell arrays, each of said plurality of standard cell arrays including at least one substrate contact cell inserted for every a predetermined number of standards cells, and said standard cells included in each of said plurality of standard cell arrays being arranged in such a manner that respective well boundary lines within the standard cells in each standard cell array are aligned on one straight line in a plan view;

a third step of routing signal lines between the standard cells included in said standard cell array, in accordance with said circuit connection information;

a fourth step of extracting a contour of a wiring area of said signal lines within said standard cell array, and placing a power supply line at the outside of said wiring area;

a fifth step of forming a contact hole at an overlapping portion between said power supply line and said power supply terminal of said diffused layer within said standard cell in said standard cell array, or alternatively, extending a power supply line of said diffused layer from said power supply terminal to said power supply line when said power supply terminal does not overlap said power supply line, and then, forming a contact hole at an overlapping portion between said power supply line and said power supply line of said diffused layer;

a sixth step of discriminating whether or not the resistance of said power supply line of said diffused layer is not greater than a predetermined resistance value stored in said constraint information file;

a seventh step of re-routing said signal lines between said standard cells when it is discriminated in said sixth step that the resistance of said power supply line of said diffused layer is greater than said predetermined resistance value, and then, returning to said fourth step; and an eighth step of routing a not-connected interconnection in said standard cell array and signal lines between said standard cell arrays when it is discriminated in said sixth step that the resistance of said power supply line of said diffused layer is not greater than said predetermined resistance value;

wherein said seventh step includes:

a first sub-step of detecting a signal line which becomes a hindrance in reducing the resistance of said power supply line formed of said diffused layer to not greater than said predetermined resistance value;

a second sub-step of removing said signal line which becomes said hindrance, and providing a through-hole for connecting between said first level metal and a second level metal at an end position to which the removed signal line was connected; and a third sub-step of discriminating whether or not the resistance of said power supply line formed of said diffused layer shortened as the result of the removal of said signal line is not greater than said predetermined resistance value, and returning to said first sub-step when the resistance is greater than said predetermined resistance value, or alternatively completing said seventh step when the resistance is not greater than said predetermined resistance value.

6. A standard cell placement and routing method for executing a placement and routing of standard cells by using a standard cell placement and routing processing system which comprises a library file which stores information of various standard cells each of which comprises a power supply terminal of a diffused layer, an input terminal of a first level metal and an output terminal of said first level metal, a circuit connection information file which stores circuit connection information of an LSI to be developed, a constraint information file which stores constraint information concerning the placement and the routing, a parameter file which stores parameter information including a power supply voltage and an operating frequency of said LSI to be developed and a sheet resistance of said diffused layer, a placement and routing system for executing the placement and the routing of standard cells selected in accordance with the circuit connection information from said circuit connection information file, by utilizing information from said library file, said constraint information file and said parameter file, and an input/output and display apparatus for displaying a history and a result of the placement and the routing and for externally inputting a control command to control said placement and routing system, the method comprising:

a first step of reading out said circuit connection information from said circuit connection information file;

a second step of reading out from said cell library file, standard cells corresponding to the read-out circuit connection information, and provisionally locating the read-out standard cells into a plurality of provisional standard cell arrays;

a third step of dividing said provisional standard cell array into a plurality of cell groups each including not greater than a predetermined number of standard cells which are located adjacent to one another;

a fourth step of selecting one cell group to be processed, from said plurality of cell groups;

a fifth step of routing signal lines between said standard cells within said one selected cell group, in accordance with the circuit connection information from said circuit connection information file;

a sixth step of extracting a contour of a wiring area of said signal lines within said one selected cell group, to register a power supply line inhibit area in said constraint information file;

a seventh step of placing a power supply line along the outside of said power supply line inhibit area within said one selected cell group;

an eighth step of forming a contact hole at an overlapping portion between said power supply line and said power supply terminal of said diffused layer within said standard cell in said one selected cell group, or alternatively, extending a power supply line of said diffused layer from said power supply terminal to said power supply line when said power supply terminal does not overlap said power supply line, and then, forming a contact hole at an overlapping portion between said power supply line and said power supply line of said diffused layer;

a ninth step of discriminating whether or not the resistance of said power supply line of said diffused layer is not greater than a predetermined resistance value stored in said constraint information file;

a tenth step of re-routing said signal lines between said standard cells when it is discriminated in said ninth step that the resistance of said power supply line of said diffused layer is greater than said predetermined resistance value, and then, returning to said fifth step;

an eleventh step of discriminating whether or not the processing for all the cell groups has been completed, when it is discriminated in said ninth step that the resistance of said power supply line of said diffused layer is not greater than said predetermined resistance value, and then, returning to said fourth step when the processing for all the cell groups has not yet been completed;

a twelfth step of replacing said provisional standard cell array composed of the provisionally located standard cells, with corresponding cell groups processed above, when it is discriminated in said eleventh step that the processing for all the cell groups has been completed;

a thirteenth step of interconnecting respective power supply lines of said cell groups processed above to form a power supply line for said standard cell array; and a fourteenth step of routing a not-connected interconnection in said standard cell array and signal lines between said standard cell arrays.

* * * * *